United States Patent
Potega

[11] Patent Number: 6,152,597
[45] Date of Patent: Nov. 28, 2000

[54] APPARATUS FOR MONITORING TEMPERATURE OF A POWER SOURCE

[76] Inventor: Patrick H. Potega, 7021 Vicky Ave., West Hills, Calif. 91307

[21] Appl. No.: 09/105,489

[22] Filed: Jun. 26, 1998

Related U.S. Application Data

[60] Provisional application No. 60/051,035, Jun. 27, 1997, and provisional application No. 60/055,883, Aug. 15, 1997.

[51] Int. Cl.[7] .......................... G01K 1/00; H01M 10/48; H01M 10/50; G01R 1/00
[52] U.S. Cl. ............................ 374/185; 429/90; 324/104; 327/512
[58] Field of Search ................. 374/45, 185; 338/35, 338/22 R, 13, 20, 307, 308, 309, 310, 311, 314; 429/90; 327/512; 324/104

[56] References Cited

U.S. PATENT DOCUMENTS

| | | |
|---|---|---|
| 3,315,200 | 4/1967 | Hannay . |
| 3,537,053 | 10/1970 | Snoberger et al. . |
| 3,852,570 | 12/1974 | Tyler ........................................ 219/523 |
| 4,882,466 | 11/1989 | Friel ......................................... 219/219 |
| 4,971,867 | 11/1990 | Watanabe et al. ......................... 429/61 |
| 5,059,895 | 10/1991 | Cataldi et al. ........................... 324/104 |
| 5,482,793 | 1/1996 | Burns et al. ............................... 429/62 |
| 5,610,571 | 3/1997 | Kuzuoka ............................... 338/22 R |
| 5,626,978 | 5/1997 | Weiss ........................................ 429/43 |
| 6,054,234 | 4/2000 | Weiss et al. ............................... 429/90 |

FOREIGN PATENT DOCUMENTS

| | | | |
|---|---|---|---|
| 56-12522 | 2/1981 | Japan ........................................ 338/25 |
| 0593085 | 2/1978 | U.S.S.R. .................................. 374/185 |

*Primary Examiner*—G. Bradley Bennett
*Assistant Examiner*—G. Verbitsky
*Attorney, Agent, or Firm*—Colin P. Abrahams

[57] ABSTRACT

A thin, conformable apparatus for monitoring functions of a power source is disclosed that includes at least one dielectric layer upon which are one or more devices selected from a group consisting of a thermistor, data lines, power conductors, and connectors. This assembly, in various configurations of its parts, attaches internally or externally to power sources that may include a "smart battery." When attached to a part or to an entire power source, said apparatus may connect that power source to its host, and other external devices, for example a charger, monitor, or power supply, whereby allowing simultaneous and concurrent data or power to flow between at least two of said devices.

12 Claims, 11 Drawing Sheets

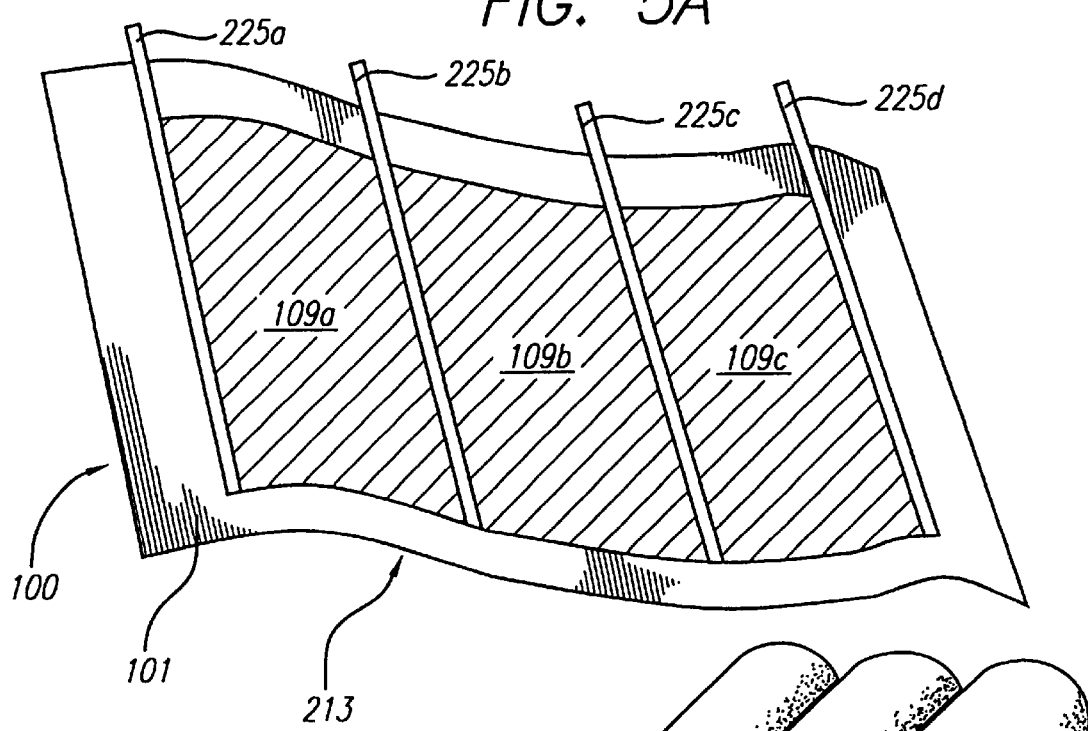
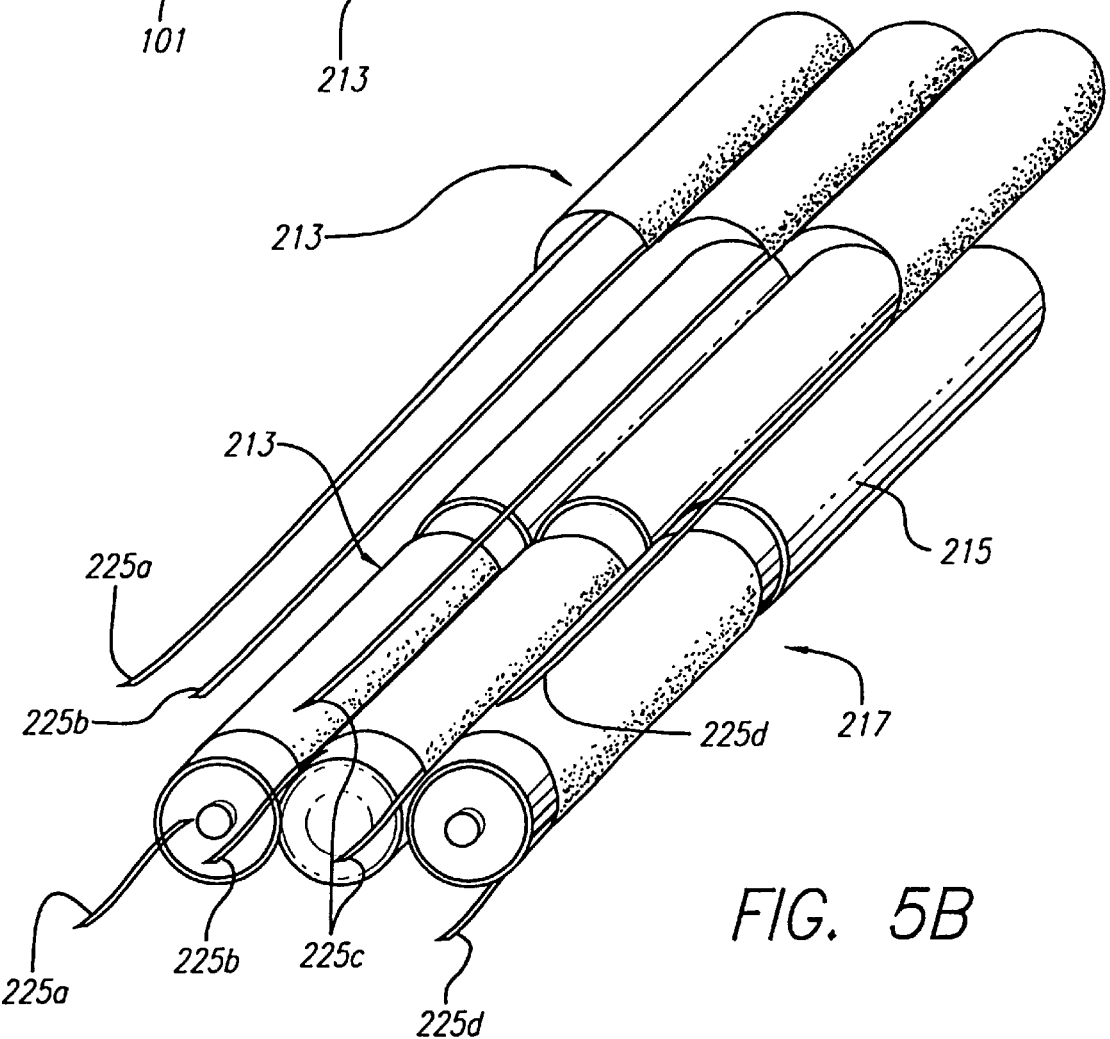

APPARATUS FOR MONITORING TEMPERATURE OF A POWER SOURCE

RELATED APPLICATIONS

This application claims priority to U.S. application Ser. Nos. 60/051,035, filed Jun. 27, 1997, and 60/055,883, filed Aug. 15, 1997, both of which are incorporated by reference herein.

BACKGROUND OF THE INVENTION

1. Field of the Invention

This invention relates to temperature-sensing devices, specifically to an improved apparatus for monitoring temperature that integrates a thermistor construct into a connector construct.

2. Description of the Related Art

Temperature-sensing devices have previously been manufactured as two general types of goods. Discrete electronic thermistor components are mounted on circuit boards, or attached in wire runs. Monitoring probes, as another class, are attached on devices or placed in proximity to them, as might be typified in laboratory test environments.

Both classes of temperature-sensing devices are characterized by a thermally-resistive element, such as a thin section of metal that changes its resistance at it warms or cools. The temperature-reactive element is traditionally affixed to two or more conductors. In the case of board-mountable thermistor components, the conductors are solderable lands. Probe-type units attach to other devices with 2–4 lengths of wire. The type of conductors employed limit the way these temperature-sensors can be used in a circuit, especially where they can be located and how they can be installed. For example, if an already-manufactured power source's internal temperatures are to be monitored, board-mountable components are not a feasible solution without opening up the power source's enclosure. Even if there is access to the internal areas of the power source, for example a rechargeable battery pack, the component-style thermistor would require the correctly-configured attachment points on a circuit board.

A probe-style device offers more flexibility as to methods of attachment, for its leads can tie into an internal circuit board.

But, what options are available if there is no internal circuit board? For power sources like battery packs, for example, some have "smart" internal circuits, while others do not. If there is no internal circuitry, neither type of thermistor affords easy implementation of temperature sensing. A probe-style sensor could be installed, assuming that the battery pack could be opened (most are sealed). But the probe's wires would have to pass through a hole made in the housing, which is not very practical. Even if an access point could be created, the thick wires routed along the outside of the battery pack would likely make it difficult to reinstall the modified battery pack into a host device's molded battery cavity. Furthermore, such a radical modification to a manufactured battery pack would require significant skills, and the modified device would be aesthetically compromised.

Beside the physical limitations imposed by the traditional form factors of existing temperature-sensors, these device's modes of operation and electromechanical characteristics create further limitations.

Flexible Circuit Boards

"Flex" circuit boards are commonplace in today's small and lightweight electronic devices. Phillips Electronics (Sunnyvale, Calif.) incorporates a small flexible circuit in its two-cell rechargeable battery pack used in that company's Velo handheld computer. A discrete thermistor component is mounted on the Velo's flex-board. In particular, Duracell (Bethell, Conn.) used a component-style thermistor on a flexible circuit in its now discontinued "smart" batteries. Neither of these devices is upgradeable by the addition of a second temperature sensor, even though the Duracell's internal flex-board had a provision for a second temperature sensor. While a probe-style ancillary thermistor could be attached to either the Duracell or Phillips battery packs, as a post-manufacture retrofit, none of the various discrete thermistor types discussed below would provide its own data interface.

Thus, while flex-circuits do routinely incorporate component-style thermistors, none of these data and power circuits incorporates an integral thin and flexible thermistor as one of the traces on the circuit board itself. They therefore lack temperature sensing capabilities, combined with data and power interfaces appropriate for use on already-manufactured power sources, such as "smart batteries," for example.

As a result of this absence of a self-contained data interface compatible with the existing contact locations on these battery packs, including the lack of integral power conductors, today's thermistors cannot be used to provide a second level of safety by monitoring heat within either of these battery packs. All of the thermistors below are also limited in their ability to deliver their temperature information to an external device, such as an external battery charger, for example.

Temperature-Sensing Devices

Temperature-sensing devices, whether a positive temperature coefficient (PTC) or negative temperature coefficient (NTC) type, have not exhibited response times adequate to the rapid heat build-up associated with today's volatile battery chemistries. Nickel-Cadmium (NiCad) and Nickel-Metal-Hydride (NIMH) battery chemistries can show thermal runaway behavior during charge, but Lithium-Ion (Li-Ion) batteries are much more unstable. Li-Ion cells' sensitivity to charge overvoltages, and even to inappropriate trickle charging, can create sudden heat build-up in cells. If this temperature increase is not ameliorated promptly, the cell can explode.

Temperature-sensing is a reliable way to detect aberrant cell behavior. Early detection of even minor temperature increases inside a cell can prevent overcharging, thermal runaway, and the explosive consequences. Even cell venting, which is an accepted method of releasing a cell's internal pressure caused by beat, can be avoided by detecting temperature increases quickly.

Heat Affects Battery Efficiency and Life

The System Management Bus (SMBus) specifications (available from the standard body's web site: www.sbs-forum.org) commonly used to define safe laptop battery charging standards, specify not only an in-circuit thermistor, but also provide for an additional temperature sensor external to the battery's circuit board.

Temperature increases during battery cell charging have detrimental effects on the cell's chemistry, often with dangerous consequences. As one battery charger application engineer notes: "Temperature increases [within the cell] generate additional chemical reactions that are irreversible . . . For example, heat creates oxygen, which builds up pressure in a nickel-metal hydride (NiMH) cell. Not only is that an unsafe condition, but it reduces battery life, because it's nonreversible." Another application engineer indicates that: "As far as temperature is concerned, . . . there's a big difference between NiCad and NiMH. It's highly recommended to use a thermistor sensor as part of the primary or back-up [charge] termination method" (McKinnon, Cheryl, "Battery mission: to charge and to protect," *Portable Design* (October, 1997), pp. 33–43).

Even "smart" circuits in rechargeable batteries leave room for improvement. Traditional component-style thermistors are mounted on circuit boards located at one end of the battery-pack's plastic housing. There can be as many as 10 cells in a battery pack, yet a board-mounted thermistor can only be in relative proximity to the nearest cells at that end of the battery pack. Cells as much as 8 inches away from this board-mounted thermistor can overheat, and the remote temperature sensor at the opposite end of the battery pack will not indicate an over-heated condition for perhaps 15 seconds or more. This is an eternity when preventing a potential cell explosion.

Thermistor Response-Time Is a Function of Distance

Critical time-to-respond is determined by the distance between the heat source and the temperature-sensing mechanism. The model is analogous to the thermostat in a house. A household thermostat can only sense room temperature near to its location, so an over-heated room at the opposite end of the house is commonplace. Battery pack enclosures are just like a house. If there is a temperature sensor (thermostat) only at one end of the battery housing, detecting a distant over-heated cell (remote room) is impractical.

Typical Thermistor Response Times

Not only does distance between a heat source and a remote temperature sensing thermistor contribute to lack of adequate response time, but the inherent lag or delay in a thermistor design also increases total response time. Thin Film Detectors (TFDs), discussed below, can have a response lag time of 13.5–55 seconds when detecting the temperature of local air (as would be the case in a battery pack, where a single thermistor is sampling ambient air temperature within the enclosure). Average response times of PTC-style sensors are typically 20 seconds. Thus, placing such slow-responding temperature sensors at a distance from an over-heating cell only exacerbates problems with timely responses.

Remote Thermistors Don't Fit Existing Battery Pack Manufacture Configurations

Although SMBus specifications provide circuit board connections for a remote thermistor, this device is rarely implemented. This is a function of thermistor configurations. Temperature sensors manufactured by Keystone Thermometrics (St. Mary's, Pa.), Semitec (Babylon, N.Y.), among others, are configured as board-mountable components. These do not lend themselves to convenient placement in remote locations in a battery pack.

Some battery pack designers embed probe-type thermistors in the opening created by stacking cylindrical cells in a cluster of three. This approach allows for some improvement in thermistor response time by locating the temperature sensor adjacent to the cells. Mounting such devices, however, typically requires potting the probe. The potting compound has an insulator effect, thus degrading the efficacy of the thermistor. Also, few battery cavities accommodate a stacked cluster of three cells. In a cell phone or laptop computer, for example, cells are typically mounted side-by-side in a flat-pack configuration to minimize product thickness.

Cost is an Issue

Among the thinnest thermistors in the marketplace are thermocouples. Omega Corporation (Stamford, Conn.) fabricates thermocouples from Copper/Constantan. The thinnest bead available is 0.005 inches (for a maximum temperature of 400 degrees F. Although quite thin, these sensor probes are still very localized. Another prohibitive issue is that they are priced at about $17.00–25.00 each. If a thermocouple were attached to each cell in a nine-cell battery pack, the manufacturing cost would be $153.00–225.00 per battery pack. The retail price of such packs would be more than $500.00!

Semi-disposable rechargeable battery packs, commonly used in consumer-electronic products, require cost-effective temperature-sensing solutions. For example, more than 700,000 battery packs are manufactured each year for laptop computers. The board-mounted thermistor used today in such battery packs costs less than 30 cents.

Thin Film Detectors (TFDs) are flat-shaped platinum-resistance devices often used for temperature monitoring in wind tunnels or air conditioning systems. They measure a mere 0.250 inches and still can only sense a localized area. An Omega "Thin-Film Detector" costs $25 each, and only covers a surface area of 0.040×0.125 inches. The same company's thin-film RTD temperature sensor unit prices at $32–71. For a cellular phone's three-cell battery pack, for example, the cost of individual-cell temperature sensing would exceed $75, for a rechargeable battery product with a typical retail price of $50.

Thermal-Ribbon RTD Thermistors

Thermistors are available configured as "thermal-ribbon RTDs", such as the Minco (Minneapolis, Minn.) S17422. While conformably thin (0.5 mm) and flexible, these thermistors are limited by a requirement for two-conductor wires per sensor. Thus, a 10-cell battery pack would require 20 discrete wires running from 10 thermistors. These wire bundles would have to be run longitudinally in the "valleys" between round cells. Manufacturing such a battery pack would be complex and unnecessarily expensive.

With the advent of newer polymorphic cells that are not cylindrical in cross section, but are rectangular and flat, the complex wiring of thermal-ribbon RTD's would increase the overall size of a battery pack. Adding width or thickness to polymorphic packs defeats one of their primary advantages—a small cross-sectional profile.

Also, existing thermal-ribbon thermistors are fabricated with precious metals, such as platinum, which increases cost. To use six or more of these in a battery pack, so that each cell has its own temperature sensor in order to provide total temperature protection, adds considerably to the cost of a NiCad battery pack.

Polymeric PTC Materials

Raychem Corporation (Menlo Park, Calif.) manufactures Polyswitch Resettable Fuses that incorporate polymeric positive temperature coefficient (PTC) materials. The Polyswitch is used herein to illustrate the PTC class of thermally-conductive materials. Other manufacturers, such as DuPont (Cornwallis, N.C.), Keystone, and Omega have similar PTC chemistries, so by examining the Raychem PTC devices, all other similar products are assumed as equivalents. Composed of a matrix of crystalline organic polymer with dispersed conductive carbon particles, the quantity of conductive particles (which are carbon black) in the polymer matrix changes its physical properties to be less or more conductive. Precipitating this change of physical and electrical states are both the effects of temperature and electrical current, with current being the predominant force contributing to changes in resistivity.

Temperature inside a device, such as a battery pack, for example, is not a predictable means of triggering Raychem's PTC. The rate of heat loss within the battery pack must be less than the heat generated within a Polyswitch device. If the heat generated within a battery enclosure, more importantly heat at the location of the PTC, is greater than the heat loss of the polymeric PTC, the total energy required to make the Raychem device trigger (and thus stop an elevated temperature state within the cell) increases. The greater the heat transfer from the Polyswitch device to the environment, the slower the device's time-to-trip. This method of utilizing PTC polymer temperature sensing makes it extremely difficult to anticipate the change in the time it takes to trip the device. There is also a noticeable break or lag in the "time-to-trigger" with these types of devices, the time-lag created by the polymers' transition from an adiabatic to an non-adiabatic state.

Current-sensing, Not Temperature-sensing Drives Polyswitch Performance

A Polyswitch device may serve as an adequate fail-safe in overcurrent conditions during battery charging, since changes in electrical current-flow resulting from improper cell impedances favor triggered events caused by resistance changes in the Polyswitch device. Devices in this PTC class are not appropriate as early-warning sensors for detecting initial increases in individual cell temperature. Manufacturers of "smart" batteries, that have built-in circuitry to monitor cell voltage, current, and temperature, rely on Raychem's Polyswitch for over-current states. Polyswitch-type devices are not used for direct temperature monitoring because of their slow response times and trip-point lags.

The Role of Previous Printed-Ink Thermistors

Resistive printed-ink devices are commonly known. For example, U.S. Pat. No. 4,882,466 (Friel), is a two-electrode PTC that uses crystalline organic polymer and a conductive filler mixture. This material is applied to a substrate in the form of an ink. Friel's invention, as with the previously described Raychem PTC (the Friel patent was assigned to Raychem Corporation), reacts to electrical current applied to conductive ink to create a heater element. Heating (often referred to as "self-heating") is a generic trait of all positive temperature coefficient (PTC) thermistors. This self-heating characteristic is usually exploited, as it is in Friel, in devices that act as heaters. An example of this is the use of PTC devices as heaters for mirrors, where temperature response is employed to allow current to flow at or below a pre-defined temperature. Thus, an automobile's external side-view mirrors are heated only when the ambient temperature of the mirrored surface drops to a pre-specified temperature. Such self-heating characteristics only contribute to slower temperature-related response times when used inside a battery pack.

While Friel suggests that printable resistive ink traces can be applied to multi-layered substrates, the defined conductive paths are for heat generation through the conductance of electrical power. There is no provision for using conductors for data transmission, as is called for in the thermistor of the present invention. Also, Friel employs layers of conductive polymers and current-carrying electrodes which are attached or bonded in such a manner that they interact electrically, and are not insulated by appropriate dielectric materials.

Thermistor Surface Area Aids Response

Traditional thermistor size parameters have been driven by their applications. For laboratory, test equipment, and industrial applications, monitoring temperature at a well-defined location has required small form factors. Needle-thin probes, circular PTCs smaller than a dime, and rectangular postage-stamp-sized patches have been the norm. However, a single cylindrical ¾-size battery cell has a surface area of approximately 5.25 inches. Present sensor design and form factors are not optimized for wide-area coverage.

For newer prismatic polymorphic cells, with typical dimensions of 1×4.5inches along their top and bottom surfaces, small surface-area thermistors are not well matched dimensionally.

Minco (Minneapolis, Minn.) manufactures a custom Thermal-Ribbon temperature sensor (Discoil) that can be ordered with dimensions as large as 2 feet square. While this sensor could cover one surface on an entire battery pack, it is somewhat thick (0.3 mm) and, more importantly, quite expensive. Discoil uses platinum elements, so it would be cost-prohibitive as a semi-disposable thermistor that covers an entire face of a battery pack enclosure. The dimensions of such a battery pack could easily exceed 24 square inches.

Ink-based PTCs Not Optimized

PTC devices, whether or not fabricated with conductive inks, are not optimized for battery temperature monitoring for several reasons. First, they are dependent on sizeable current flow (often 200 Ma or more) to create changes in temperature-response along the conductive ink surfaces. In theory, if one were to use such a PTC temperature-sensing device on a cell, it would only further warm the cell, as current from the battery charging circuit flowed through the sensor. This would be an inappropriate response, and diametrically opposed to the desired effect of keeping battery temperatures low.

Second, because PTC sensors rely on electrical current to achieve functionality, they create a drain on available power. Battery cells can overheat through rapid discharge, where the load imposed by a PTC thermistor only hastens the discharge rate. Even in a charge mode, a PTC thermistor on each cell in a 10-cell battery pack would contribute an excessive additional load, requiring extra power from the charging circuit.

Third, electrode resistivity is critical to the proper operation of PTC sensors. Friel describes specific formulaic electrode width-to-length ratios to establish a stable and repeatable temperature trigger. Electrodes are to be "as thin as possible," according to Friel, with average thicknesses (widths) of 0.0001 to 0.01 inches. Such precision requires close manufacturing tolerances. Furthermore, in an application in which the PTC unit is to be flexed, for example when wrapping a temperature sensor around a single battery cell, these thin traces can crack or delaminate from the substrate material.

Fourth, the lack of durability of such devices as Friel's and others discussed here, do not readily lend themselves to external attachment on pre-manufactured battery packs, where consumer wear-and-tear would degrade the thermistor's performance by constant handling. Because all cellular phones and laptops have removable battery packs, as do many other consumer electronic devices, the frailty of devices like Friel's creates durability concerns. Affixing PTC thermistor constructs to battery enclosures that are repeatedly inserted into, and removed from, battery bays or slots, indicate that abrasion would become an issue. Compounding the problem is the thickness of thermistors like Friel's and the thermal-ribbon and RTD configurations previously discussed. Especially troublesome is the thick mass created at the hardpoints where the thermistor's surface electrodes transition to (often thick) wire conductors. Battery packs usually fit snugly into molded cavities in their host devices, so thickness parameters must be extremely thin.

Fifth, the Friel device requires the inked electrodes to be printed on conductive surfaces onto which have been deposited or laminated resistive elements, such as electrodeposited copper or other conductive metals. Such a multiple-deposition or dual-layered process increases manufacturing complexity and unit cost.

Externally Attached Labels Using Thermally-Sensitive Materials

Attached labels on battery cells or battery packs are addressed by U.S. Pat. No. 5,626,978 (Weiss), wherein a label incorporates thermally-sensitive materials as part of a test circuit. Weiss does not allow for connectivity to a local or remote circuit, as would be the case with the present invention used with a "smart" battery's A/D circuitry. Weiss does not address any connectivity to external temperature monitoring or charger devices. Weiss' invention is restricted to detecting battery capacity, expressed as a visual display of a "fuel gauge." The information displayed on a battery label in certain modalities of the present invention is passive and unchanging, such as a company logo or user instructions. Weiss' invention, especially its display, is active. By depressing a selected area, Weiss' battery label displays remaining battery capacity. The present invention operates autonomously and without contacts or switches of any sort.

In summary, a variety of features and characteristics of today's thermistors leaves room for improvement in temperature monitoring of power sources, for example rechargeable and removable batteries (especially "smart" batteries), and external power supplies and battery chargers):

1). Traditional temperature-sensors, whether board-mountable electronic components, or attachable/placeable probes with wire leads, cannot be easily integrated into, or attached to, already-manufactured power sources, such as battery packs.

2). Even if a battery pack, as an example of a power source, could be opened up, if the power source requiring temperature monitoring does not have an internal circuit board, traditional thermistors are not of much use. Lacking an internal circuit that provides A/D functions, as well as appropriate contacts on the battery housing, a power source's temperature data cannot be accessed by an external monitoring device.

3). Power sources that do have internal A/D circuits and accessible data contacts on an external, cannot be readily modified to add additional temperature monitoring. New contact points on the power source-device's housing, dedicated to the new thermistor, would have to be created. These new contacts would have to be appropriately placed to interface with existing data contacts on the host device, for example, contacts in the battery cavity of a "smart" battery-equipped laptop computer would have to be modified to provide a data interface to the newly added thermistor.

4). Slow response times, as a consequence of a thermistor's inherent lag, or "time-to-trigger."

5). More importantly, slow response times due a thermistor's physical configuration create limitations as a remote temperature sensor. These physical characteristics include size, mounting or attachment requirements, and flexibility.

6). The inability to attach or bond the thermistor to a cell or battery pack housing using materials that act as insulators.

7). The need to have at least two conductors per thermistor.

8). A PTC thermistor's inherent characteristics, dictated by materials, to self-heat from current flow, or to experience lag times due to changes in external and internal temperature variants.

9). The use of power resources to energize current-flow-enabled "self-heating" PTCs that can further drain a battery's charge, or create additional load demands on a power supply or battery charger.

10). Cost of thermistors, driven by fabrication materials primarily, in a consumer marketplace where low-cost battery packs are the norm.

11). Small "foot print" or area coverage of thermistors.

12). The need to redesign the battery pack enclosure, whether because of additional bulky wiring, or to accommodate cross-sectionally thick sensors.

13). The requirement to hold close manufacturing tolerances to create ultra-thin strands of precious metals, or to control the complex dimensions of printed-ink electrodes.

14). The need for specific substrates, which often must be coated with metals, and which are often costly to fabricate.

15). Lack of durability, especially of thermistors which have a reasonably thin cross-sectional profile, when attached to the exterior of a removable battery pack.

16). For an external application of a thermistor to an existing battery housing, the absence of an effective data interface to a "smart" battery, or the battery's host device.

Therefore, there exists a need for an improved apparatus for monitoring temperature that addresses one or more of the deficiencies in today's apparati for monitoring temperature.

SUMMARY OF INVENTION

The present invention is directed to an apparatus for monitoring temperature known as a "thermistor assembly" for detecting and communicating changes in temperature of power sources. The thermistor assembly of the present invention may be applied to an exterior or interior surface of a power source, for example a battery cell, group of battery cells, battery pack, power supply, or charger to monitor the temperature of a power source during operation, with its own data and power paths that enable the thermistor assembly to communicate temperature and related information to a plurality of devices. The apparatus is in direct contact with the power source, whereby it provides an improved response time for temperature sensing, while a self-contained construct of conductors and connectors allows for the temperature information to be easily accessed. Alternatively, the thermistor, separate from the thermistor assembly, can be attached to one or more power sources in a plurality of modalities that optimize temperature response time.

In one embodiment of the present invention, the thermistor assembly comprises a resistive element, at least one non-conductive medium, one or more conductive elements, of which two conductive elements are electrically coupled to the resistive element, at least one connector capable of carrying power and data signals, and a suitable method of attaching one or more of the components of the thermistor assembly. The resistive element is applied to one of the non-conductive media and, as an option, other non-conductive media may be bonded or attached to the medium with the resistive element, to form a multi-layered construct. The resistive element may comprise various materials having resistive properties such as, but not limited to, inks and metals. Conductive elements may comprise various materials having conductive properties such as, but not limited to, inks and metals. Each non-conductive medium is preferably a thin material that is flexible and capable of conforming to one or more surfaces of a power source.

Separated Constructs

In an alternative embodiment, a multi-layered thermistor assembly can be separated into various sub-assemblies, one or more of which may be placed inside a power source, while one or more of the sub-assemblies are placed on the outside of that power source, or a housing containing that power source. It is not essential to the operation of the invention that more than one layer of the multi-layered thermistor assembly be attached either to the inside or outside of a power source.

Should such a divisible thermistor assembly be configured in a modality that provides a sub-assembly that provides temperature sensing without layers for data or power conductors, this thermistor sub-assembly may be configured as a single non-conductive stratum upon which is applied an area of continuous thermally-resistive ink. This continuous ink area is partitioned into segments by the application of conductive traces. Thus configured each inked segment provides an independent thermistor that can be accessed by its two conductors, one of said conductors being shared by the adjacent segment of thermally-resistive ink.

Connectors and Connector Constructs

In any embodiment of the thermistor assembly, any removable connectors may be eliminated by attaching conductive elements or resistive elements to a power source's existing contacts, connectors or wiring points. Non-removable connectors may replace removable connectors in certain modalities of the thermistor assembly, so that connector type, location and configuration are interchangeable in those embodiments of the present invention that indicate appropriate connectors.

The thermistor assembly may be in the configuration of a thin covering similar to a product label applied to the exterior of a power source, such as a single battery cell, multiple adjacent battery cells, or a battery pack housing, for example. The flexible and conformable qualities of the invention are achieved by the use of electrically conductive inks and thin metals. The configuration of the thermistor assembly is so thin as to not significantly add to the exterior dimensions of the power source, for example, such that the thermistor assembly can be attached to a battery pack housing without increasing the overall dimensions of the enclosure to the point of interfering with the easy insertion and removal of the battery pack in its battery compartment. The configuration of the thermistor assembly or any subassembly thereof, both dimensional and flexural, provides for conforming around corners of various sizes and shapes of power sources, such as battery cells and battery housings, for example.

In an alternative embodiment, the thermistor assembly of the present invention may include a suitable interface to a data-enabled power source, an example of which is a "smart" battery pack's connector or internal circuitry. Such a data interface may be achieved by permanent conductors, or semi-permanently attached conductors. Power conductors may also be included, should suitable power signals be required by functions (such as charging or delivering primary power) at the power source or other connected "smart" devices. Such a thermistor assembly may interface with multiple contact points, or use at least one pair of conductors each for power or data functions. The data or power interface may be internal to the power source, or external. Moreover, the connector construct of the thermistor assembly of the present invention can exist and function independent of its thermistor construct, and thus is not limited to being attached to thermistor construct. For example, the connector construct's data or power conductors can be located on the exterior of a power source, while the thermistor construct can be internal to a power source. Alternatively, both the thermistor and connector constructs can be internal, or the data or power conductors can be internal to a power source, while thermistor construct is attached externally to that power source. Other variants and combinations are possible, as best suits the available space within the battery, the exterior size and shape of a battery housing, the location of contacts, whether battery is already manufactured, and other similar variables.

OBJECTS OF THE INVENTION

Accordingly, several objects and advantages of the present invention are:

1). To improve temperature-sensing response times by using a rapid-response ink formulation, in conjunction with a form factor that allows the thermistor to be in direct contact with each battery cell. For pre-manufactured battery packs, the present invention affords an opportunity to add safety features by attaching the thermistor directly to a battery enclosure.

2). To provide a thermistor with an ultra-thin cross-sectional profile, so that existing plastic battery pack enclosures do not have to be redesigned or increased dimensionally.

3). To provide a highly flexible temperature sensor that can be easily contoured to conform to various cell shapes and dimensions.

4). To provide a thermistor with "large-foot-print" form factors, both to detect heat across the large surfaces of pre-manufactured battery packs, or to cover a substantial "wetted area" of a polymorphic cell.

5). To provide a temperature sensor with good flexibility, so that it can be contoured to irregular battery housing shapes, especially around corners.

6). To provide a direct-applied thermistor that can eliminate any adhesive whatsoever by printing thermally-resistive conductive inks directly onto materials like the nylon faces of polymorphic cells, for example.

7). By providing a direct-applied thermistor that requires no adhesives, to eliminate any loss of sensitivity or response time due to insulator materials or gaps when bonding a pre-manufactured ribbon or thin-film thermistor.

8). To provide a series of thermistors inside a battery pack that require only four thin, flexible, inexpensive, and dimensionally non-critical conductors to connect three discrete temperature sensors, i.e., less than two conductors per sensor.

9). To provide a PTC thermistor that does not require the application of significant amounts of current, but instead operates efficiently at microamps to conserve battery or charger power resources.

10). To provide a PTC temperature sensor that does not self-heat, but remains at an ambient temperature corresponding to that of the monitored device, such as a battery cell, to which it is attached.

11). To provide a method of manufacturing low-cost thermistors using non-critical silk-screening processes and relatively inexpensive thermally-resistive conductive inks.

12). To provide a manufacturing process for large production quantities of thermistors that is time- and cost-efficient.

13). To provide a thermistor with variable geometries that can be readily adapted to different form factors and footprints.

14). To minimize the total bulk and mass of devices required to attach a thermistor to every cell in a multiple-celled battery pack.

15). To provide a thermistor that does not require close manufacturing tolerances, or the control of complex dimensions but, instead, can be printed in simple patterns or shapes.

16). To provide a temperature sensor that can be applied to low-cost, readily available dielectric materials such as pre-printed labels, or even coated paper stocks.

17). To provide very-thin cross-section to an externally-applied aftermarket thermistor, so that it does not disrupt the clearance tolerances within the powered device's battery bay or compartment.

18). To provide a temperature sensor that consumers can attach themselves to battery packs as aftermarket temperature-sensor upgrades and that, when damaged from normal wear-and-tear, can be discarded and another applied.

19). To provide a thermistor that has removable conductors, or that can be attached by a simple connector, thus eliminating the thickness of hardwired attachment points along the edge of the sensor.

20). To provide a thermistor that can comply with existing standards and specifications for "smart" battery products.

21). To provide a suitable interface to a "smart" battery pack's connector for a thermistor that must communicate with other "smart" devices.

22). To provide an integrated thermistor and connector interface that can be manufactured cost effectively, using known processes and that can produce such an integrated product in large volumes.

23). To provide temperature sensing and related data and power functions in a thin, flexible unit with a footprint large enough for temperature sensing across an entire pre-manufactured battery pack.

24). To provide a temperature sensor with a data/power connector interface that is versatile enough to be built into a battery enclosure, or that can perform all necessary sensing, data, and power functions when attached externally to an existing battery housing.

Further objects and advantages are to provide an ink-thermistor printing process that can include the use of company logos, bar codes, user instructions, or other printable information applied on the same substrate as the temperature sensor.

Still further objects and advantages will become apparent from a consideration of the ensuing description and drawings.

BRIEF DESCRIPTION OF THE DRAWINGS

FIGS. 5A and 5B show a temperature-monitoring construct of the present invention that includes a printed thermistor layer applied as a continuous area of thermally-resistive ink that is segmented into three discrete thermistors by the application of shared conductors.

DETAILED DESCRIPTION OF THE DRAWINGS

Figure 1:
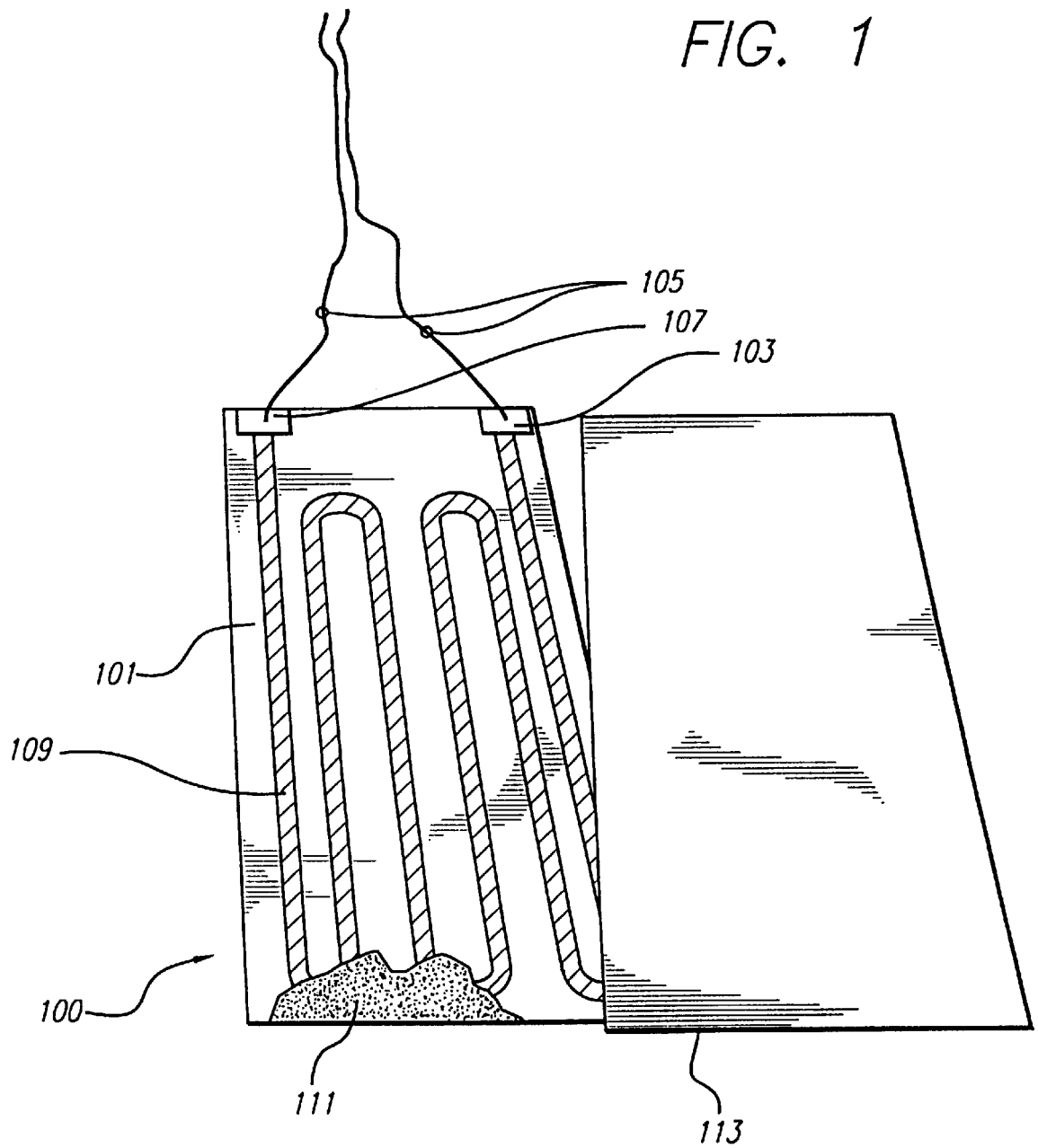
FIG. 1 illustrates various aspects of a basic thermistor sub-assembly of the present invention, along with an optional attachable protective sealed cover layer.

As shown in FIG. 1, the thermistor sub-assembly of the present invention is generally referred to by the numeral 100. Thermistor 100 is comprised of the elements defined below. Two general embodiments of thermistor 100 are described. One embodiment uses resistive elements such as platinum, or equivalent thermally-reactive metals such as iron or copper constantan, for example, that react to changes in temperature by exhibiting detectable differences in resistance. The second embodiment uses thermally-resistive inks, or equivalents such as thick- or thin-film polymer/carbon composites, for example.

Thermistor 100 generally comprises at least one medium or stratum 101, a resistive element 109, an optional dielectric medium 113, and electric leads 105. Medium 101 has non-conductive properties, is thin enough to allow good thermal transfer and to provide flexibility, and to which can be applied traces of thermally-resistive material, such as platinum or thermally-resistive ink, for example. There may be more than one such strata 101, as shown by a second dielectric medium 113. The two layers 101 and 113 can be bonded one to the other by means that seal the perimeters, such as with a flexible adhesive, so that resistive element 109 is captive between two layers of medium 101 and 113. Examples of media which exhibit suitable characteristics for use as medium 101 or 113 are Mylar (DuPont brand name), Kapton (3-M brand name), vinyls, coated papers, and label stock.

Mylar and Kapton have been used as substrates for various metals, for example copper for "flex" circuit boards. Companies like TV Interactive (Fremont, Calif.) have printed conductive inks on mylar and kapton for circuits which behave like membrane contact switches. TV Interactive has karioke implementations of their conductive ink devices on sale in Japan. Consumers press an area on the packaging of an audio CD-ROM. This area is a thin-membrane switch that activates a remote audio track. Thus, the consumer can hear music selections in the store, simply by activating a membrane switch on the CD-ROM's packaging.

Paper is only suitable for medium 101 if thermistor 100 is used to monitor temperatures within a reasonably low temperature range (a maximum temperature of about 200-degrees Fahrenheit). Paper, if not laminated or otherwise bonded to a more stable media, such as foil or vinyl-type plastics, exhibits "creep" in the presence of moisture and or temperature. Changes in the physical dimensions of paper goods is not desirable for thermistor 100. Curling, rippling or other dimensional distortions are tolerable to a certain extent, but delamination of resistive element 109 from stratum 101 is to be avoided, as is delamination of thermistor 100 from the surface to which it is affixed, such as the casing of a battery cell, for example.

3-M (Minneapolis, Minn.) and Fasson (Avery-Dennison's (Pasadena, Calif.) brand name for commercial label stock) manufacture both paper and foil label stock which can withstand temperatures in the 150–200-degree Fahrenheit range.

If ink is being used as resistive element 109, it can be applied to "coated" stocks, such as for example "coated" paper stock used for labels and badges, which often have an adhesive backing. A carbon/polymer-based resistive ink, or equivalent, can be applied to the coated stock on either the plasticized side, or to the adhesive-backing side (but not on the adhesive backing). If the application is to the adhesive side, the thermally-resistive ink which is used in thermistor sub-assembly 100 is applied as the first step, and then the adhesive coating is applied over the resistive ink. The last step is to apply the "peel-off" backing, which typically has a wax or plastic non-bondable surface to facilitate its removal from the adhesive surface. These are often referred to as "crack-and-peel" stock in the printing industry, and are available from companies such as Avery/Dennison (Pasadena, Calif.). The Avery "Fasson" brand is for industrial label makers, and is not marketed to either the general printing industry, or to the mass market). Commercial paper stores carry "crack-and-peel" stock in numerous thicknesses (weights) and with many finishes, including metalized and colored front faces.

Most of these "coated" stocks use plastics to achieve their smooth outer surface finish, and even those which look metallic are actually plastics or vinyls. There are "paper foils," which are true metals bonded (usually laminated) to plastics. These may not be desirable, in that the resistive value of the platinum or ink can potentially be compromised, although there is no indication of that empirically.

Protective Layers

Second medium 113 can be eliminated if thermistor 100 is to be applied to a surface with suitable bonding material 111 so that thermally-resistive element 109 will not be compromised by handling, or by a chemical interaction between resistive element 109 and the adhesive. In embodiments using thermally-resistive inks, element 109 can be protected by overprinting printable varnishes, acrylics or lacquers commonly available to printers (not shown in FIG. 1) Flexible adhesive 111 in such an application, as shown in the Figures which follow, may be either permanent, or of a low-tack, so that it is removable.

The implementation of this single-sided embodiment of thermistor 100 is only recommended if it is fabricated and applied in a controlled environment, preferably where fabrication and application machinery is used. The fragile nature of resistive element 109 is such that it can be easily damaged if a second layer, such as dielectric medium 113, is not present. The advantage of this single-sided application is that the thermistor's resistive element 109 is directly in contact with the surface being monitored for changes in thermal characteristics, which is illustrated in the various Figures as power sources, such as battery packs or individual battery cells, for example.

Thermally-Resistive Materials

The resistive element 109 that makes thermistor 100 in FIG. 1 work as a thermistor sub-assembly of the apparatus for monitoring temperature that is the present invention comprises, in one modality, a metal or metallized material applied in such a fashion that when electrical current passes through it, it exhibits a known electrical resistance characteristic which can be measured. By the type of material used in resistive element 109, as well as its physical dimensions (the thickness, i.e., depth, of conductive ink that is applied on medium 101, as well as the width of the conductive ink trace), resistive element 109 varies its electrical resistance as the temperature of resistive element 109 changes. The result is that the resistive-value of resistive element 109 can be read as either a change of current or voltage along leads 105 in FIG. 1. These voltage or current readings are translated by an external device (not shown) to resistive values that correlate with temperature. Contact pads 103 and 107 weld or solder leads 105 to resistive element 109. Conductive epoxy cements can also be used to electromechanically attach leads 105 to contact pads 103 and 107, or crimped or stapled attaching devices can be used.

Thermally-Resistive Metals

Resistive element 109, as expressed in metal, is built by one of two methods. The first method is to laminate a thermally-reactive metal in an even layer onto stratum 101. The depth and width of the platinum is dependent on the thermal and or resistive range to be detected with device 100. Very thin or narrow traces of platinum will give better thermal characteristics at low temperatures. Platinum thicknesses of 1–2 $\mu$m will yield stable thermistor values from about 20 degrees F to +950 degrees F. It is most important that the layer be of an even thickness, since layer thickness and the width of the platinum trace both determine the final resistive/thermal characteristics of resistive element 109.

Once an oversized trace of resistive element 109 has been applied to stratum 101, either sputter etching or laser trimming can be used to define the final configuration of element 109. Optimum precision is achieved by a combination of both sputter etching and laser trimming, as discussed in "Laser Trimming vs. Sputter Etching of Platinum Thin Film Temperature Resistance Elements," by Walter Diehl (Sensors Magazine, May 1997, pp. 87–89). While this article uses examples of platinum applied to $Al_2O_3$, the photolithographic sputter etching process is generic to mylar and kapton, and also lends itself to some coated paper and label stocks, especially "fluid-line tapes" as often used in the aircraft industry for hydraulic and other hose labels. The precision of the laser to control the depth of the cut defines the substrates which are suitable for laser trimming.

An alternative modality of thermistor sub-assembly 100 is to fabricate a hybrid temperature sensor using aluminized paper available from Hazen Paper (Holly, Ak.). This material is a 10 pt paper backing, to which is laminated one or more layers (as thin as 0.0005 mm) aluminum foil. This material can be die-cut ("kiss" cut preferred) to create two narrow (about 0.150 mm) of conductive traces, between which can be silk-screened thermally-resistive ink.

Printed Thermally-Resistive Inks

While temperature-response resistive metals can be used for thermistor 100, thermally-resistive conductive inks are preferred in the best modes for building temperature sensors used in rechargeable battery devices. Primary considerations for selecting inks over metals are cost, ease-of-fabrication, "thin-ness," durability, and flexibility.

Thermally-resistive element 109, when embodied as an ink, can also be applied directly onto materials used in the fabrication of battery devices. For example, a thin nylon material is used as the enclosure for polymorphic battery cells. This material can be run through a silk-screen press prior to the stock being trimmed to size. The "semi-dry" Lithium-Ion anode and cathode materials are then captured between two layers of nylon, and heat sealed along all edges. Thus, thermistor 100 does not require a discrete stratum 101, as the nylon material itself serves that purpose.

Thermally-resistive inks 109 can be suitably thinned and spray-applied to the inside of plastic battery pack housings, or hand silk-screened on either the inside or outside of such materials. Thus, there are several modes where actual materials used in fabricating the final product to which thermistor sub-assembly 100 serve as suitable substitutes for stratum 101.

Inks for resistive element 109 may have at least a portion thereof made of a thermally-variable-resistance material having a resistivity that changes in response to ambient temperature. Preferably, the variable resistivity ink material has a positive resistive coefficient, so that it exhibits upward changes in resistance with increases in ambient temperature.

Generally, positive temperature coefficient (PTC) inks have characteristics that make them suitable for thermistor 100's resistive element 109. While the fabrication of thermistor 100 is not limited to a particular brand of commercially-available ink, Acheson Colloids, Inc. (Port Huron, Mich.) manufactures a PTCR ink that exhibits characteristics shown in FIG. 11.

Figure 11:
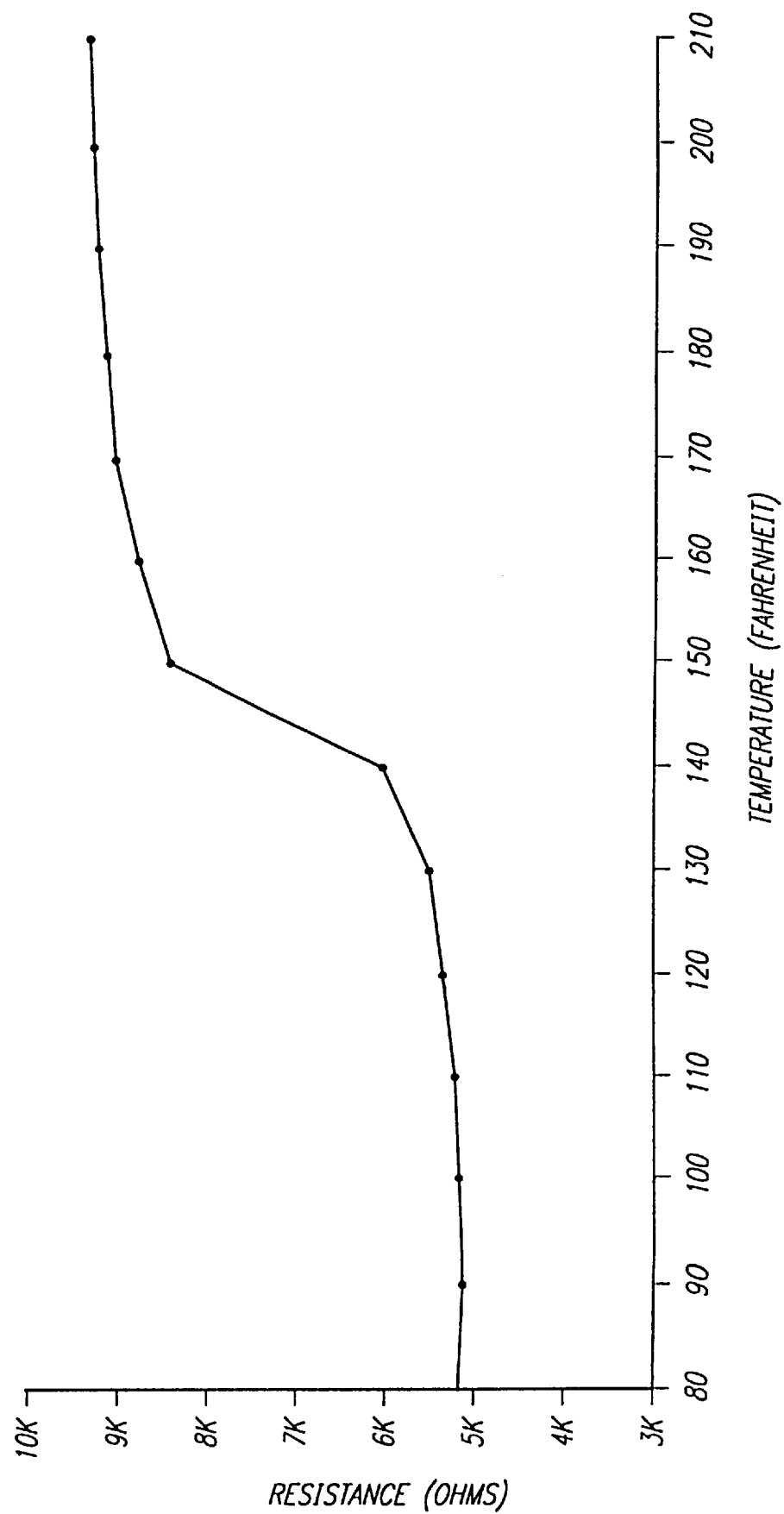
FIG. 11 is a graph of resistance versus temperature characteristics of a resistive element of the "thermistor assembly" of the present invention.

Carbon-based conductive ink as resistive element 109 is achieved by both the amount of conductive carbon which is admixed in the ink fluid, as well as the physical dimension of the resulting trace. By varying the carbon content, as well as the deposition (depth) of the ink, and the width of the resulting trace, suitable resistive performance is achieved. By varying the combination of polymeric and acrylic materials and carbon, an Acheson ink can be configured to a particular temperature "trip" or "trigger" point. This trigger point is a characteristic sharp increase in resistance at a pre-defined temperature, as shown in FIG. 11, which triggers at 145-degrees Fahrenheit. This phenomenon is observable in many other PTC inks, but the Acheson material is a "non-self-heating" formulation, so there is no migration of the material's physical states, from adiabatic to non-adiabatic, as a consequence of temperature and current. Being non-heating, it is not necessary to power the material with significant amounts of current.

Performance Characteristics

As shown in FIG. 11, the behavioral characteristics of resistance-versus-temperature of the Acheson PTCR inks are illustrated. The thermistor configuration charted in FIG. 11 has a rectangular inked area measuring 2.5×5 inches, at a thickness of 0.0004 inches. Reference FIG. 5A as an illustration of the physical layout of the test thermistor (only one of the three segments 109 was created for the tests).

To calculate the resistive value of an area of the Acheson PTCR ink used to create the chart in FIG. 11, "Resistance (ohms)" is the known resistive value of the ink, divided by the width (as a ratio of the length), multiplied by the length. Width is always the largest dimension of a rectangular printed area, and length is the shorter of the two dimensions. Thus, with an ink having a known resistive value of 2K Ohms, if Width=0.5 cm, and Length=0.1 cm, the calculated resistive value is 400 Ohms. To increase the resistive value of a printed area, without increasing the width and length, a second pass through the silkscreening press will increase the Ohm-value.

This footprint of ink coverage shown in FIG. 11 yielded a resistive value of 5K Ohms at 72 degrees Fahrenheit.

Conductors were painted onto a polyester substrate, using an Acheson silver-pigmented ink (Electrodag 6S-32). Two conductive traces (225a and 225b, for example in FIG. 5A) were created to contact the PTCR ink along its 5-inch widest edges. The thermally-resistive ink was applied to 0.03 mm thick polyester, and cured in a standard printing dryer. Once cured, the ink was "exercised" by heating it to the trigger-point temperature three times. This last process stabilizes the ink's resistive properties, so that it is more linear during the heating process. Acheson formulated the test ink to trigger at 145 degrees Fahrenheit.

The test was performed in an autoclave with a source of variable heat, and a small fan to create evenly distributed convection heating throughout the heat chamber. A calibrated digital probe thermometer was mounted to read the ambient air temperature approximately 10 mm above the thermistor's surface. A multimeter was attached to the silver-ink painted edge conductors, so that only the current from the multimeter was activating the resistive-conductive elements of the thermistor's ink.

The Acheson ink has many properties that are compatible with thermistor 100. In particular, the printed material can be trimmed to various resistive values with ordinary tools, such as a paper cutter. Multiple resistor values can also be created by applying conductive traces at various locations along a fully inked area.

FIGS. 5A and 5B show thermistor 100 expressed as a continuous coating of ink applied to a flexible, non-conductive medium 101. Conductors 225a, 225b, 225c, and 225d are then applied at appropriate locations to alter the resistive value of each segment. These conductors can, for example, be narrow copper strips bonded in place with conductive epoxy cement, or using SMT PTF inks (from Acheson Colloids (Ontario, Calif.). Alternatively, these traces can be printed with silvered conductive inks. Thus, three equally-resistive segments 109a, 109b, and 109c are created with a simple process.

FIG. 1 Operation of Invention

Thermistor 100 is designed to cover a larger area than today's commercially available temperature sensors. As such, the size of insulator medium 101 matches the device being monitored for changes in temperature, for example a cell in a multi-celled battery pack. Resistive element 109 is capable of detecting changes in temperature as a function of the material's (metals or inks) ability to change resistive value as the ambient temperature of the device to which it is attached warms or cools.

For example, if a battery cell is being monitored, the measured resistance (expressed in Ohms) might be 5K Ohms at battery's ambient temperature of 72 degrees Fahrenheit. If the battery cell is then connected to a battery charger, the temperature of the cell will move upward, because of internal changes to the cell's chemistry that generate heat during the charge cycle. During charge, the temperature increases, and resistive element 109 of thermistor 100 also warms, since thermistor 100 is attached directly to the outer casing of the cell.

An external temperature-monitoring circuit (not shown) is coupled to thermistor 100 in FIG. 1 by leads 105. Leads 105 are connected to the edges of resistive element 109. Thus, resistive element 109 is a variable resistor in a lead 105, such as a wire that is attached to a device that is monitoring changes in resistance on lead 105. The resistance detected on lead 105 increases from the original 5K Ohms in a predictable way (it is predictable because the behavior of resistive element 109 has been charted, as shown in FIG. 11, and perhaps stored in an external monitoring device's software.

Tracing the changes in resistance, software can translate different Ohm values detected on leads 105 as values relating to temperatures, so that 6K Ohms might, hypothetically, equate to 95 degrees Fahrenheit. Software can also have a stored temperature value that acts as an "alarm," so that once that pre-defined "Do Not Exceed" temperature is reached, the battery charger will be shut off. In today's "smart" batteries, the software that matches resistance values in thermistor 100 to corresponding temperatures is stored right in the battery pack.

There's usually a circuit, as well, that enables the battery to turn off its charger by sending a request to the attached charger. Thus, thermistor 100 is essential to the safe operation of the charging process, and temperature readings (as resistance-values) can be taken every 1/20th of a second, if necessary. Temperature sensing is enough of a priority that there is circuitry in the battery to which a second thermistor can be attached. Typically, there is already one temperature sensor built right on a "smart" battery's circuit board. It is this second thermistor function that thermistor 100 performs. Monitoring temperature with a second thermistor is so vital a function that the "smart" battery specifications drafted by Intel (Santa Clara, Calif.) and nine other companies, reserves a dedicated contact on a five-contact connector, specifically and exclusively for temperature sensors like thermistor 100.

The Importance of Cell Temperature Monitoring

As resistive element 109 continues to warm, its resistive value (related to its temperature that is an expression of the cell to which it is attached) might reach the pre-set "alarm" value. This elevated temperature indicates a problem with the battery charging process. The safest thing to do is to shut off the charger—and as soon as possible. Since either the charger, or the battery circuit itself, is constantly monitoring the temperature of thermistor 100, it is important that resistive element 109 is accurately representing true values. Not only is accuracy important, but timely information about actual temperatures is also vitally important.

A temperature sensor like thermistor 100 can be extremely accurate, i.e, it can differentiate a minute change in temperature, but if it takes time for resistive element 109 to change its value, no amount of accuracy can compensate for a "lagging" response. The more lag time, the longer the battery problem goes uncorrected. If the delay before the real temperature of a cell is reported is long enough, a cell can go into "thermal runaway." This condition means that the internal temperature of the cell has exceeded a "point of no return." The cells internal heat is feeding itself and generating even more heat—the cell is now a glowing ember that is using its own chemicals to feed the impending fire. More oxygen is being generated, and oxygen makes excellent fuel for a fire or explosion. The longer it takes for thermistor 100 to catch up to the actual cell temperature, the higher the risk that the impending fire or explosion will not stop, even when the charging function is disabled.

To ensure that cell temperatures are reported immediately, thermistor 100 is configured to cover as much area on a battery cell as possible. Thermistor 100 can literally be wrapped around the entire cell, or can be in contact with just a portion of the cell surface for example, a thermistor] in contact with at least 10% of the cell's surface is sufficient for temperature monitoring. The fact that thermistor 100 is adapted to be placed directly on the cell is, in itself, something that significantly accelerates response times. The closer to the heat source, the faster the response, and the more accurate the temperature information. The thermistor 100 may be coupled to a cell by an adhesive 111, or by other means for chemical or mechanical bonding well known by those skilled in the art.

Technically, there is no reason why thermistor 100 cannot get even closer to the heat source. If non-conductive medium 101 is of a chemically impervious material, such as single-linked polyethylene, thermistor 100 can be immersed into the chemicals inside the battery cell. Laminating resistive element 109 between two layers of chemically non-reactive material requires a second layer 113 as shown in FIG. 1. Heat sealing the edges, or using adhesives that can withstand prolonged exposure to battery chemicals, creates a sealed construct that can be inserted into the battery cell. This is advisable for lead acid cells, such as car batteries for example, so that readings in the immediate vicinity of the battery plates can be made.

Printing Makes the Difference

The best mode of monitoring temperature in a multi-celled battery pack is to attach a thermistor 100 to each individual cell. However, with battery packs that can contain as many as ten cells, the cost of outfitting every cell must be considered. Thermistor 100, in one of its modalities, can be fabricated with resistive element 109 as a thermally-resistive ink. These is inks behave just like metal thermistor elements. The big advantage in using inks is that they can be printed (silk-screened), which is a low-cost process that can produce hundreds of thousands of thermistors. Depending on the surface area to be covered by resistive ink 109, a high-speed silk-screen printing press can produce 50,000 thermistors per hour.

Fortunately, there are also a wide variety of low cost non-conductive insulator materials 101 for use as a medium. Any non-porous material that can pass through a silk-screening press is a candidate for a suitable insulator. Coated paper or card stocks, adhesive-backed labels, nylons, polyesters, and mylars, among others, all work well as mediums 101 or 113. To keep costs down, leads 105 can be coupled to resistive material 109 with staples, or metal-impregnated adhesives, for example.

Thermistor 100 offers significant advantages to an apparatus for monitoring temperature, that is the present invention. By locating thermistor 100 directly on the cell, and producing it inexpensively by using cost-effective printing processes, improved battery charging safety is achievable.

Multiple Cell Application

Figure 2:
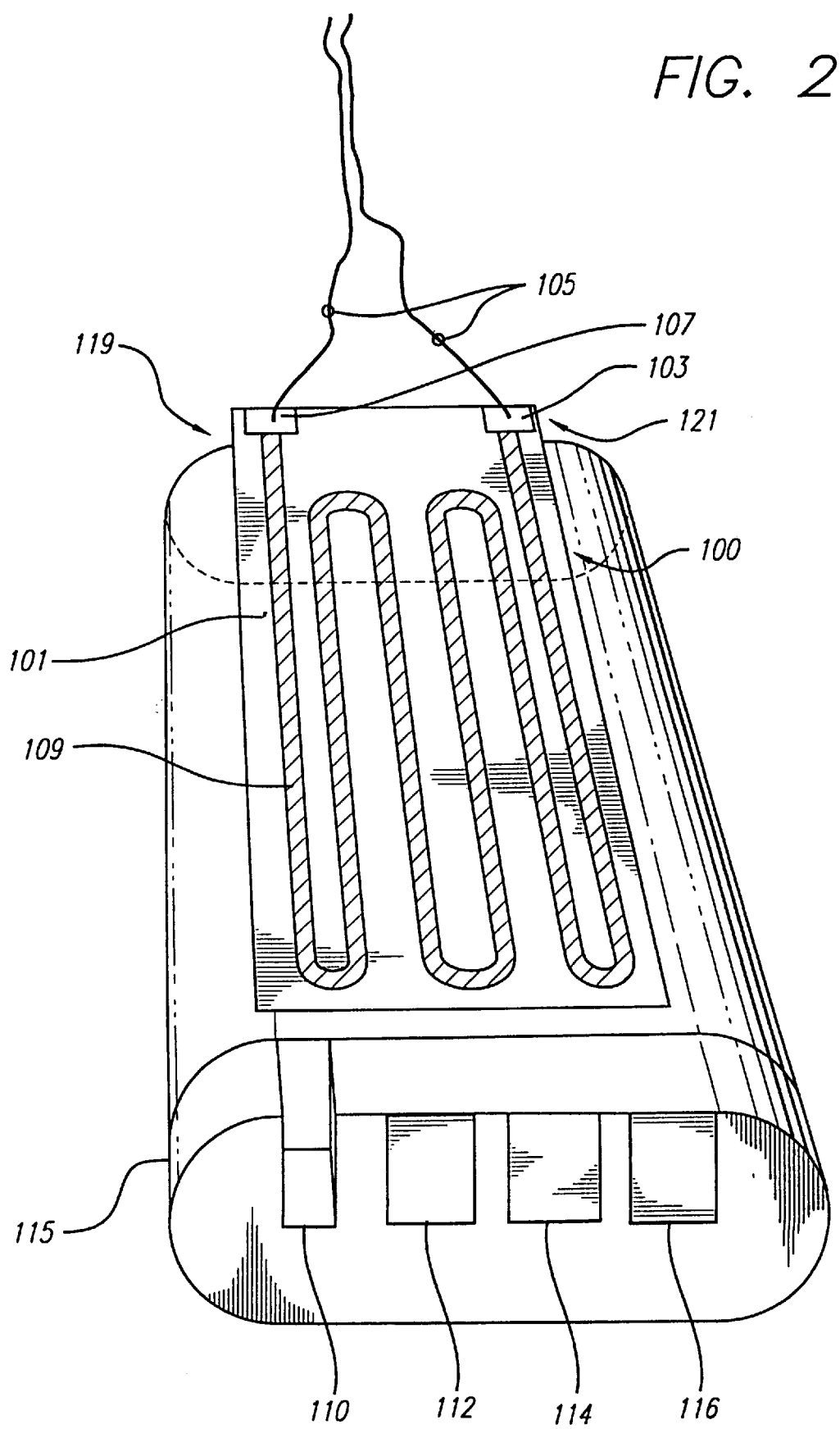
FIG. 2 shows the basic thermistor construct, of FIG. 1 applied to a generic removable battery pack as an "upgrade" to the already-manufactured rechargeable battery pack.

FIG. 2 shows thermistor 100 installed on a multi-celled battery housing 115. Battery housing 115 is shown as merely representational of most generic plastic battery enclosures. Use of thermistor 100 is not limited to multi-celled packs, since a thin, flexible thermistor 100 can be easily wrapped around each individual cell within the pack. Such an application is detailed in FIGS. 5A and 5B, and 7. This has significant advantages over thermistors which are embedded within the battery cluster, since a more immediate and direct reading of each cell enhances battery monitoring performance, as compared to a thermistor placed in the space adjacent to the cell. Because thermistor 100 can be built inexpensively, especially with ink and common paper materials, vinyls (labels, for example), or mylar/kapton, attaching a thermistor to each cell is practical.

Monitoring individual cell temperatures provides better safety measures than obtaining a relative reading inside the gap created by stacking individual cells next to each other. In multi-celled packs, individual cells respond differently to charging. A particular cell may have, over its numerous charge/discharge cycles, vented multiple times, resulting in changes to its impedance. Internal chemical reactions (such as stalactites or anode pitting) may have developed as a function of improper usage, for example memory in a NiCad or NiMH pack. A cell can malfunction for numerous chemical or mechanical reasons, and that individual cell will have a change in its resistance which will alter its normal charge curve.

Lithium-Ion (Li-Ion) battery chemistry is significant in the behavior such cells or packs exhibit when being charged. First, "cell matching" is essential to manufacturing a "balanced" pack, so each cell's resistive value is carefully monitored when assembling alike cells into a pack. Over time, and especially with cells using heavy metals or rare metals (e.g., cobalt), the cells become mismatched and no longer charge evenly. Today's "smart" batteries, with their internal temperature monitoring and sophisticated cycle-counts, are designed make data available to a processor-based host device, so that cell failure during charging can be detected early enough to avoid an explosion. Li-Ion packs, because they are voltage-charged and current-charged, can readily go into a dangerous failure mode. Temperature elevation is one of the best indicators and precursors of a battery pack about to explode.

A battery failure, as detectable by changes in temperature, is a very dramatic event, and readily identifiable. This is especially true if the particular battery pack has been monitored several times during its normal charge and discharge cycles. Software, which is reading the thermistor values over time, can be accurately tuned to thermistor 100's transmitted values, expressed as voltage or current, and a very practical look-up table can be built by the software in a very short period of time. An appropriate alarm voltage or current level can then be set, which is used to shut down the charging circuit should the battery pack reach that alarm temperature.

External Applications

FIG. 2 is shown as an external application because thermistor 100 can be retrofitted to an existing battery pack which was not manufactured with internal temperature monitoring. This allows the battery user to "upgrade" battery 115 with temperature telemetry with an easy-to-produce and inexpensive thermistor. The thermistor, when fabricated with inks on inexpensive paper, vinyls or mylar/kapton, can be viewed as disposable. One modality of thermistor 100 is to use a low-tack adhesive, so that thermistor 100 can be removable and reusable.

The thin wall design of most of these battery "packs" 115 makes them suitable for an externally-applied thermistor 100. While the wall-thickness of the battery enclosure makes it necessary to temperature-compensate thermistor 100's calibration, the advantage of being able to fabricate thermistor 100 in numerous footprint configurations affords a better overall detection system than one or two thermistors inside the battery pack housing. Calibration of thermistor 100 can be achieved easily. If a transmitter (analog-to-digital converter) is used between battery 115 and the host device (not shown, but connected to leads 105), it can be adjusted to deliver a suitable output voltage or current. Because the battery does not have to be in use, as is the case with an internally embedded thermistor, a very accurate reference temperature can be set in the transmitter. From that precise ambient surface temperature reading while the battery is totally passive, the voltage or current scale can then be calibrated when the battery is put into use.

Thus, thermistor 100 brings to previously "dumb" battery packs, a reasonable safety feature by providing an easy-to-install and inexpensive thermistor.

Applications of thermistor 100 are not limited to external applications. Battery pack manufacturers, for example, may find it efficient to attach thermistor 100 to the inside of a battery cavity or housing.

Internal Applications

The ultra-thin profile of thermistor 100, makes thermistor 100 practical as a label on individual cells. Current thin-film thermistors, as available from Minco (Minneapolis, Minn.), or Omega (Stamford, Conn.), are as thin as 0.010 inches (typical). Device 100 can be built as thin as 0.005 inches (typical), with ink and 0.5-mil mylar/kapton. Battery cell manufacturers can continue to build their cylindrical cells to the same outside diameter, and existing molds for battery-pack housings do not have to be re-manufactured to accommodate thermistor 100.

Since individual cells are typically labeled by the manufacturer for purposes of identification, thermistor 100 serves both as a product identifier (for example, a bar code can be printed on the outer surface or a mylar, paper or vinyl label, with thermistor 100 printed on the back of that printable surface, and a layer of adhesive to bond the label to the battery cell applied over thermistor 100's ink trace). Thus, FIG. 2 can be viewed as representational of an individual cell, as well as a group or pack of cells.

Figure 7:
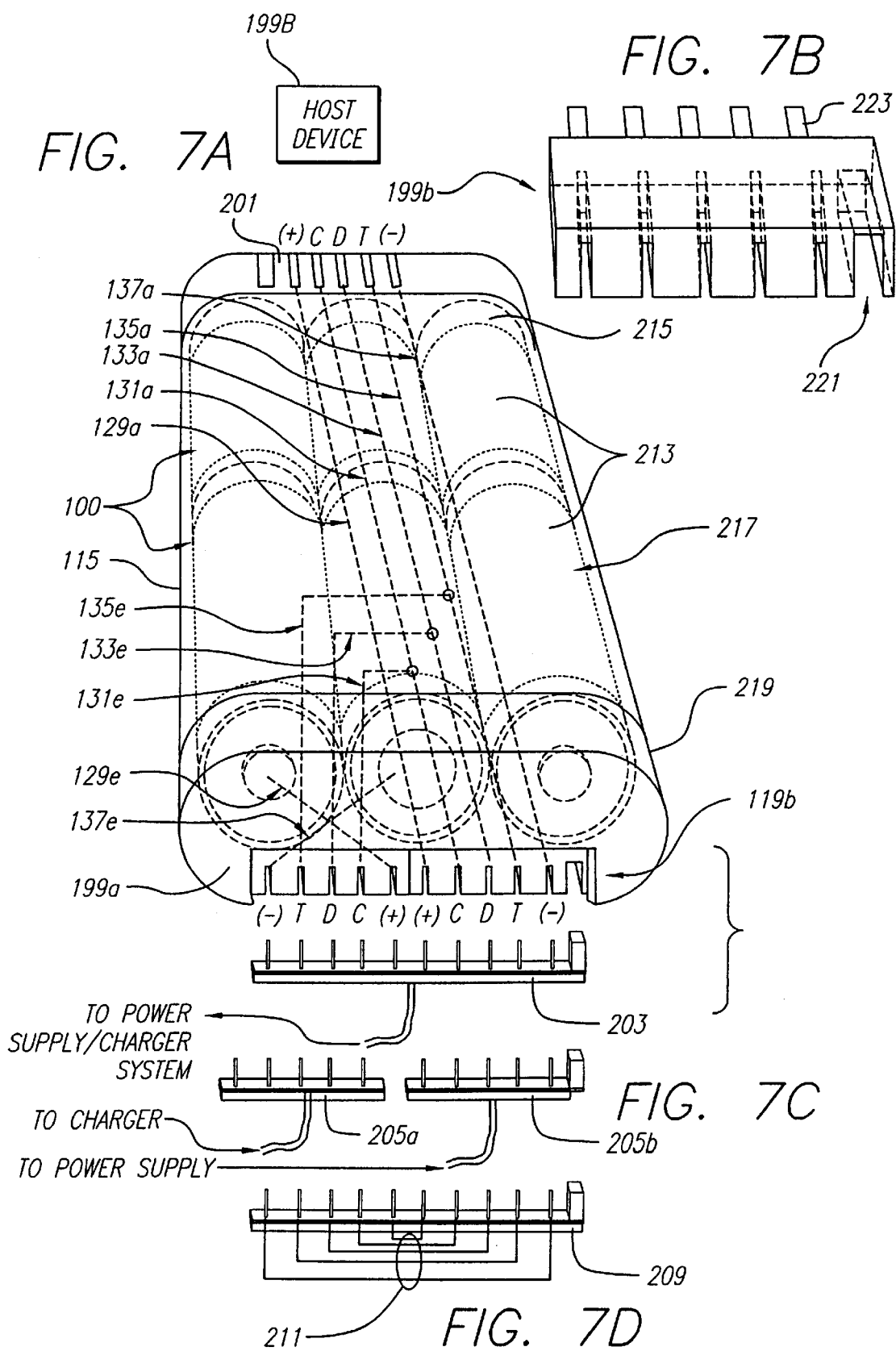
FIG. 7 shows a multi-layered "thermistor assembly" with a thermistor sub-assembly from FIG. 5, and the conductors expressed as external data and power traces in FIG. 6 herein shown as a permanently-wired circuit within the battery pack.

FIGS. 5A, 5B, and 7 more clearly show the implementation of thermistor 100 on individual cells within a battery pack.

Extensible Tab

Thermistor 100 can be mounted to a battery or battery-pack housing 115 (FIG. 4), so that some portion of it extends. This allows a tab 119 to be folded downward, out of the way, thus providing extra clearance along the outside for the battery pack to fit in its compartment. The style of battery 115 represented here, which is loosely based on the Duracell BR-15 form factor, inserts lengthwise into a molded cavity (not shown), so the overall clearance for wire leads 105 is achieved by folding extension tab 119 downward. An adhesive is applied to the bottom side of tab 119, to make contact with the battery housing 115. Tab 119 will adhere to the back end of battery housing 115 when folded downward. As shown in FIG. 2, the stratum 101 is facing outward, with resistive element 109 on its underside, as the "middle" layer, with an adhesive bonding this construct to battery housing 115.

If ink is used for resistive element 109 (FIG. 4), there is no need to sandwich resistive element 109 between two non-conductive strata 120 and 121. Additives (usually rubber-based agents) can be admixed into the ink which make it flexible, thus eliminating the risk of damaging the resistive element 109 when tab 119 is folded downward. No second-layer of material like 113 (FIG. 1) is necessary to preserve the integrity of resistive element 109, providing that tab 119 is folded only once. Repeated flexing of tab 119 can result in cracking of the resistive used for resistive element ink 109. Another benefit of this "bare" resistor design is that thermally-conductive adhesives (for example, Omega's (Stamford, Conn.) "Omegabond" and "Thermcoat" cements) can be used to enhance thermistor 100's sensitivity. These adhesives also form a non-conductive barrier.

Figure 3:
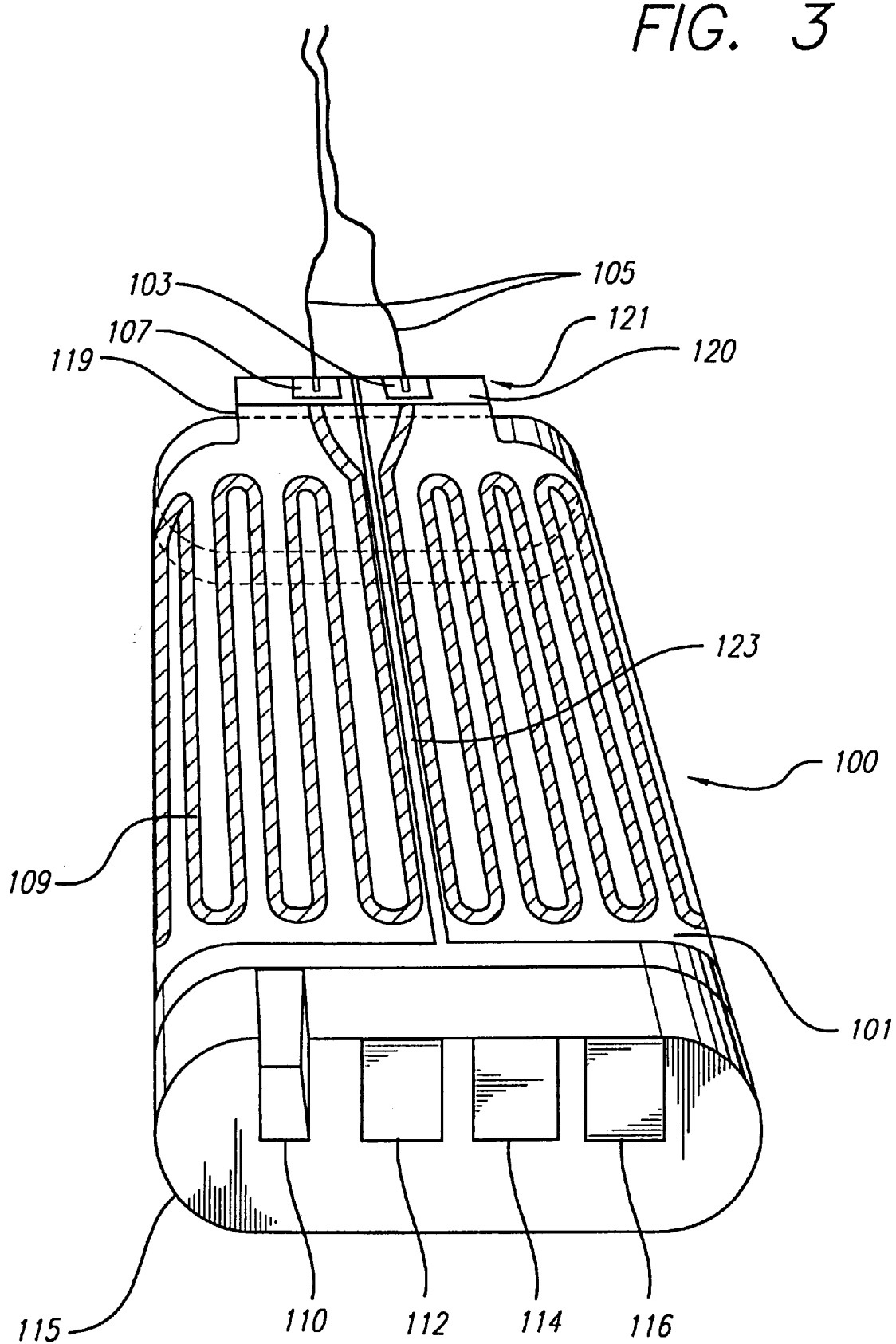
FIG. 3 shows a modality of the flexible thermistor sub-assembly of the present invention wrapped around a generic removable battery pack, with an extended connector tab to which are hardwired conductors.

Shown in FIG. 3, is an expanded thermistor 100 according to the present invention, which totally surrounds battery 115. Battery 115 is shown here to reveal the two ends of expanded thermistor 100, as it is wrapped around the outside of the battery housing, and gap 123 indicates the edges of expanded thermistor 100. Tab 119 is shown terminating in a reinforced stiffener 120. Stiffener 120 adds strength and rigidity to tab 119, and also ties together the two lengthwise sections of thermistor 100. Lead wires 105 can be eliminated, and alligator clips or other detachable probes can be used on conductive pads 103 and 107.

Figure 4:
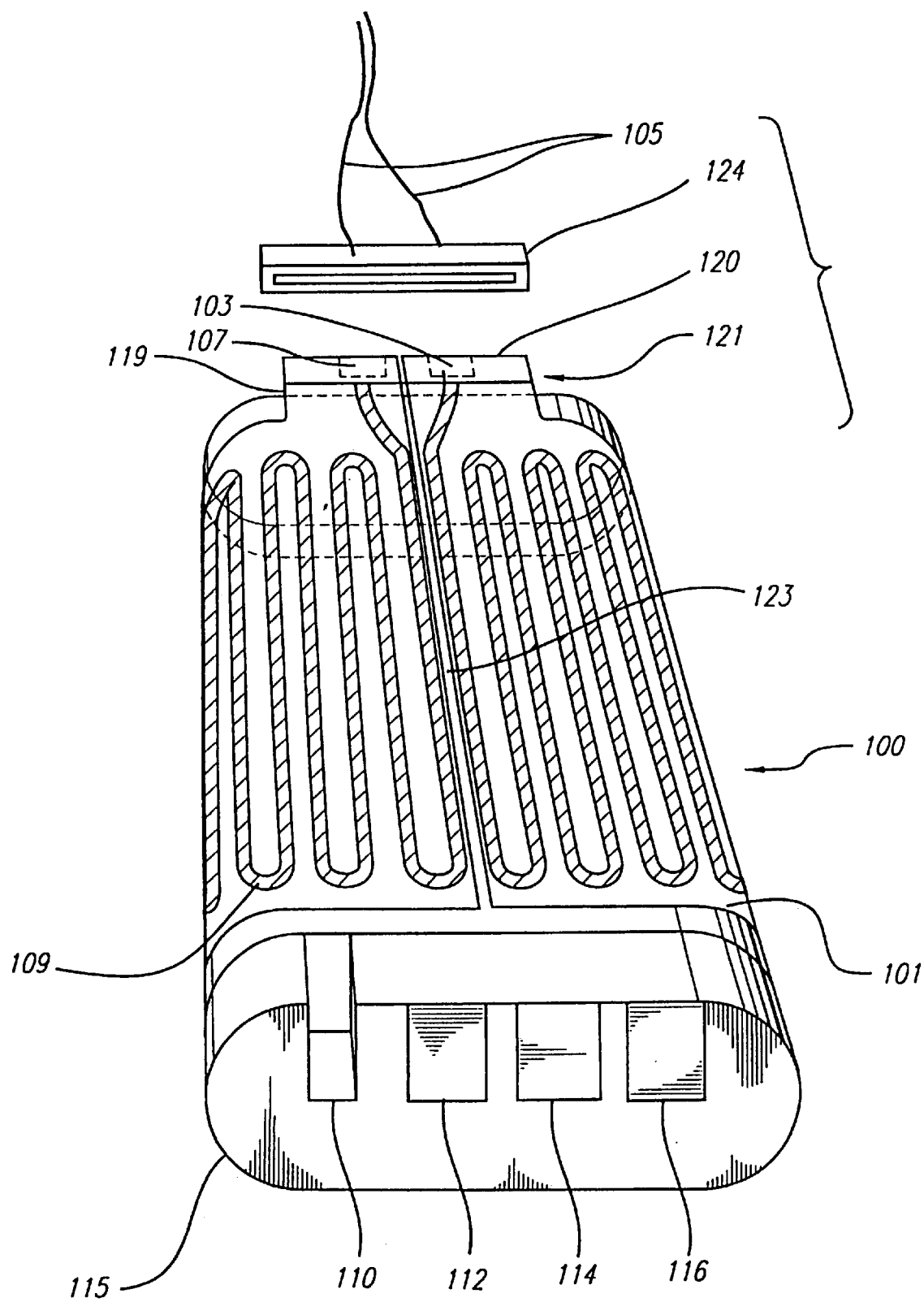
FIG. 4 shows a flexible thermistor construct of the present invention, having a simple two-wire data interface, attached to a battery pack, with a removable connector that attaches to an extension tab on the thermistor.

As shown in FIG. 4, tab 119 may be being used as an insertable male plug for a removable connector 124. This modality is detailed in FIGS. 9 and 10. Stiffener strip 120 can be thick enough to enable end-tab 119 to act as a male connector. Removable connector 124, or an equivalent, can be used as a connector on a test-probe lead, or to facilitate changing removable battery packs. Expanded thermistor 100, if fabricated from paper-stock and ink, is not so rugged that normal wear and tear from inserting and removing the battery pack in the host device will not eventually compromise the integrity of the device. By making a removable connector 124, the more expensive wires 105 (as typified in FIGS. 1 and 2) are preserved when externally-applied expanded thermistor 100 is discarded. Also, user attachment of thermistor 100 to a battery housing 115 is facilitated, and the host device into which battery pack 115 is inserted (not shown) need not have wiring dangling from its battery compartment.

Because resistive element 109, especially if comprised of conductive ink, is very thin, the outer surface of expanded thermistor 100 is so smooth that it can be imprinted with information. In the iterations shown in FIGS. 3 and 4, virtually the entire battery can be imprinted with advertising or product information. The smaller form factor of thermistor 100 in FIGS. 1 and 2 also afford good advertising or labeling opportunities.

Expanded thermistor 100's flexibility and thin crosssection makes it viable as an overall surface thermal detection device for both external and internal uses. These larger footprints can be handled economically with carbon-based conductive ink silk-screened on label stock, coated paper, or polyester for example, or other low-cost media 101.

As shown in FIGS. 5A and 5B, thermistor 100 may be a multi-segmented panel 213 that attaches to more than one contiguous cell 215 within a battery pack (not shown). This modality affords several benefits over individual thermistor 100s individually applied to each cell. By employing one contiguous section of non-conductive medium 101, additional cutting and trimming of materials is eliminated. In manufacture, larger pieces are easier to handle. The screens required to silkscreen a thermally-resistive ink onto insulator 101 are simplified, as well.

This configuration, not limited to the three discrete but connected panels 109a, 109b and 109c shown, can also be effective as a panel 213 attached to the external housing or enclosure of a multi-celled battery pack. As external panel 213, each discrete segment 109a, 109b, and 109c monitor a zone or area of a battery pack housing, wherein each zone correlates to groups of cells inside the battery enclosure. The response rate of an external thermistor panel 213 would not achieve detection of cell heat as rapidly as an internal modality. However, the external mode does make for an efficient and cost effective thermistor 100 for battery packs that are already in use.

A major advantage of using multi-segmented panel 213 is that two conductors are eliminated (conductors, generically, are represented in FIGS. 5A and 5B as 225a–d). In the crowded confines of a battery housing (not shown), open spaces for large number of wires are rare. If three discrete thermistor 100s were to be used on one column of three adjacent cells 215 as shown in FIG. 5B, six separate conductors (two for each thermistor 109a, 109b, and 109c) are required. By using shared conductors 225b and 225c, two conductors are eliminated. In six-cell pack 217, four conductors are eliminated.

Trading Space-Savings for Circuitry

Eliminating conductors can only be achieved by making the remaining conductors 225a–225d. An N-signal switch, or equivalent, is required to activate each segment 109b, or 109c of segmented thermistor 213. To read segment 109a, for example, conductors 225a and 225b are accessed by a data acquisition device (not shown). For example, current flows from conductor 225a, across resistive ink area 109a, to the opposite conductor 225b. Once that resistive value has been acquired by a remote device, conductor 225b is left active, and conductor 225a is switched off, and replaced by conductor 225c. Thus configured, resistance across segment 109b is read. The same process continues for reading segment 109c, as conductor 225c stays active, while the N-signal switch deactivates conductor 225b and switches to conductor 225d.

This switching process, while elemental, does add a small incremental cost to the "smart" circuit embedded in a battery pack. This cost is offset by the savings associated with fewer conductors, as well as savings in the cost of adhesives to attach the extra two conductors. Less materials handling, and ease of installing fewer wires into the battery enclosure indicate that the trade-off in adding a switch is justifiable. If, as in cell configuration 217, there are several columns of cells, the savings are even more pronounced, for one N-signal switch can be used to control conductors for two thermistor panels 213.

Assembly Considerations

The process of fabricating thermistor panel 213 follows standard silk-screening and flex-board techniques. Note that inked panels 109a, 109b and 109c are one contiguous resistive ink application. Only conductors 225b and 225c determine segmentation, and these conductors are applied directly over the pre-printed ink surface. When laying out panel 213's segments, all three are of the same size. Any variants among the segments will result in mismatched baseline resistance readings. The need to calibrate each segment is avoided by ensuring that the spacing between conductors 225a, 225b, 225c, and 225d is identical.

Conductors 225a–d can be any thin-cross-section conductive material. Strips of copper foil have advantages. Circuit board repair tape, such as GC Tech (Rockford, Ill.) "Pure Copper Circuit Tape #22-509", or equivalent with non-conductive adhesive, has desirable properties in this application. The adhesive side of the tape is left face-up, and the exposed copper side is bonded with a silver-pigmented epoxy cement, or an equivalent such as Acheson Colloids' SMT PTF inks, directly onto conductive ink areas 109a, 109b, and 109c. The outward-facing adhesive on the 3-M tape is used to secure segmented panel 213 to cells 215. The tape's adhesive also secures the loose leads of conductors 225a–d to cell 215's casings.

Design and Fabrication Notes

Most cell casings are metal, so care must be taken to not short any part of segmented panel 213 or its conductors 225a–d. Dielectric materials such as printers' varnishes or acrylic overcoatings, or equivalents, are acceptable to protect resistive inked areas 109a–c. Conductors 225a–d can be held in place with insulating double-sided tapes, or equivalents. Panel 213 may be adhered to cells 215's surfaces, to avoid abrasion or any movement. Battery manufacturers often sleeve cells with heat-shrink plastic. These cells are preferred to ensure proper electrical insulation between the cell and panel 213.

It is not recommended that panel 213 be mounted with the resistive ink surfaces facing outward. Cells move within even the closest-fitting battery enclosure, and resistive-ink scratches readily, even with protective over-coatings. Even minor blemishes in the inked surfaces may deteriorate performance.

If resistive inks from Acheson are used to create any thermistor 100 devices, it is recommended that the material be heat-cured. Standard printing dryers are suitable for curing. Avoid handling freshly-inked materials. Oils from finger prints may alter the resistive characteristics of the inks. Micro-scratches, from sliding sheets of printed materials over each other may also alter the electrical and thermal characteristics of inked areas.

Finally, the Acheson inks should be cycled 2–3 times to full operating temperature. If manufacturing constraints prohibit this stabilization process, accurate temperature readings will optimize after several cycles during normal operation of the thermistor.

Figure 6:
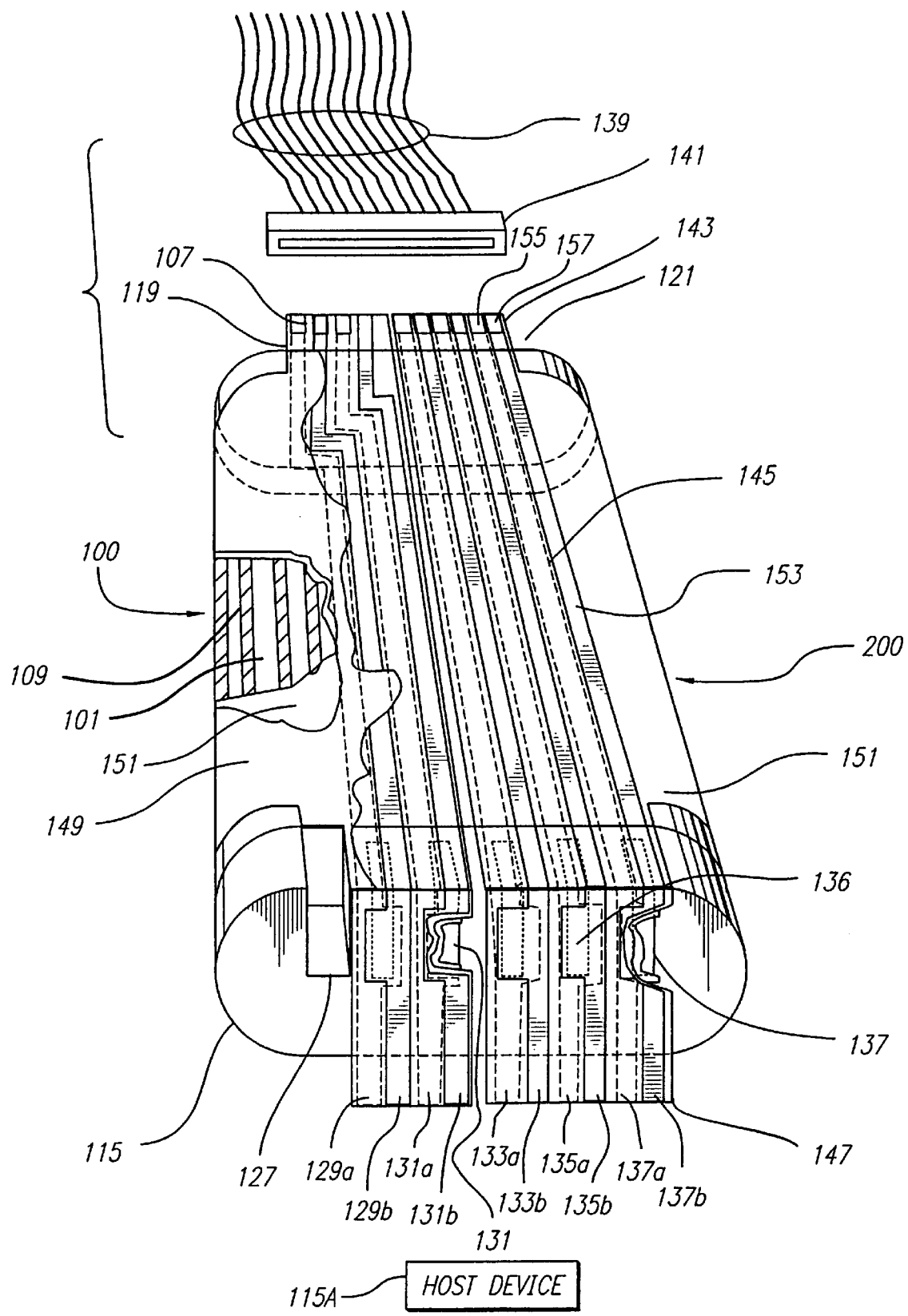
FIG. 6. shows the elements in FIGS. 1–4, integrated into a multi-layered construct of data and power conductors separated by insulators, to form an apparatus for monitoring temperature.

In reference to FIG. 6, a resistive element 109, which is part of expanded thermistor 100 previously shown in FIGS. 3 and 4, is shown in a partial cutaway section. The covering layers 151 and 149 can also be seen. Over thermistor 100 has been affixed a multi-layer construct 200 which serves as an integrated data and electrical connector interface to battery contacts. Battery contacts 131 and 137 are visible here in cutaways, while three other contacts 129, 133, and 135 are more fully visible in FIG. 8. As represented here, these contacts are indeterminate in their functions. While the placement and configuration of contacts 129, 131, 133, 135, 137 are representational of a "smart" battery pack, as expressed by Duracell (Bethell, Conn.), the number of contacts, their location, spacing or configuration is not limited. They are illustrated as multiple contact points to show the adaptability of connector 200, but there need be only one pair of conductors for connector 200 to properly function. The function of each contact 129, 131, 133, 135, and 137 can be power, or data. A locator key 127 is shown, but it is only representational.

Connector construct 200 can exist and function independent of thermistor 100, but the preferred mode is to incorporate thermistor 100 as part of connector 200. Connector 200 is not limited to being attached to thermistor 100 in any way, nor to its location within connector 200. For example, connector 200's data or power conductors can be located on the exterior of battery pack 115, while thermistor 100 (in any of the modalities described herein) can be internal to battery 115. Or both thermistor 100 and connector construct 200 can be internal (see FIG. 7), or connector 200's conductors 145 and 153 can be internal to battery 115, while thermistor 100 is attached externally to battery 115. Other variants and combinations are allowed, as best suits the available space within battery 115, the exterior size and shape of a battery housing, location of contacts, whether battery 155 is already manufactured, and other similar variables.

Conductor strips 145 and 153 can be comprised of conductive materials, for example copper traces on an insulator film 151, such as mylar or kapton. Conductors 145 and 153 can also be, as is resistive element 109, of conductive ink. Given the current-carrying limitations of conductive inks, as compared to metals like copper, a hybrid of connector construct 200, comprise of both conductive inks and metals, is indicated. Thus, if conductors 145 and 153 are carrying power at contact 137, copper or tin, for example, would be more suitable than conductive inks. Battery pack 115, for example if used in a laptop computer, could deliver 2–3 amps at a connector 137. In low-current-carrying implementations, such as data, conductive inks can provide efficiencies of manufacture or cost. Both materials are typically available as traditional flex circuit design and fabrication, so such a hybrid connector construct 200 is implementable.

Figure 9:
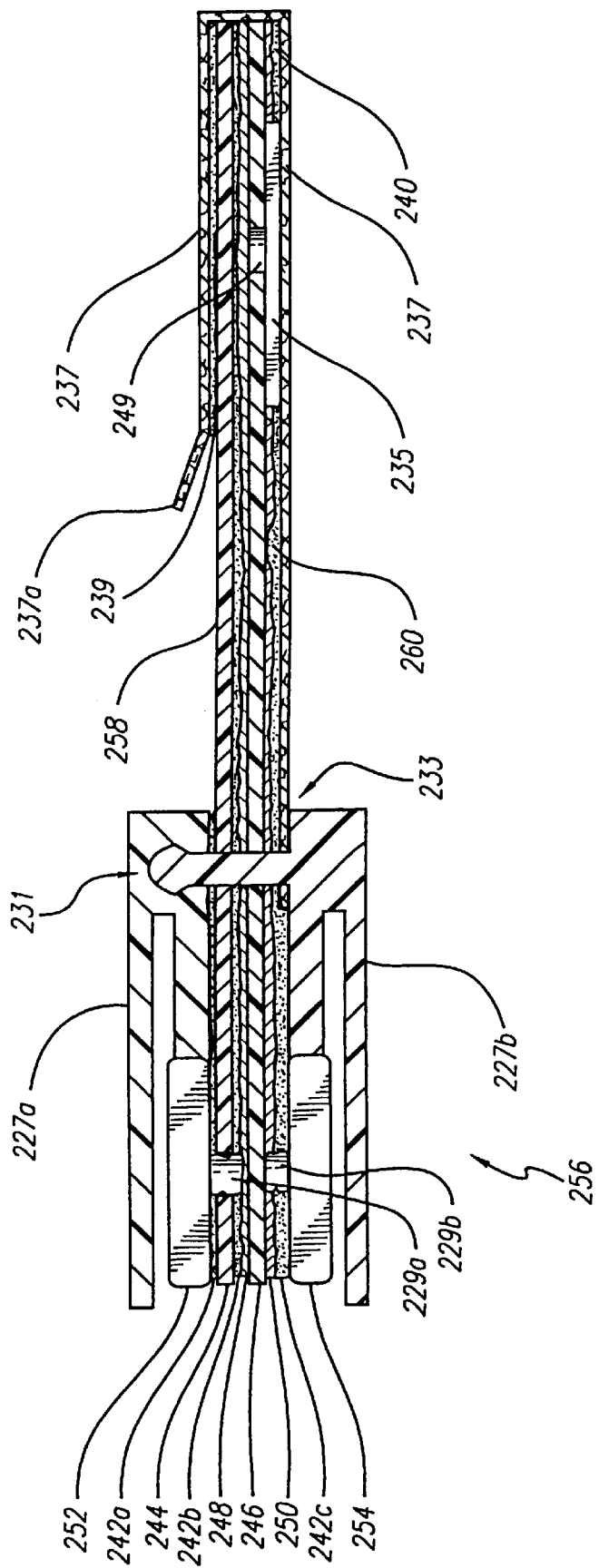
FIG. 9 shows a cross-sectional side view of one of the removable connector tabs in FIG. 8.
Figure 10:
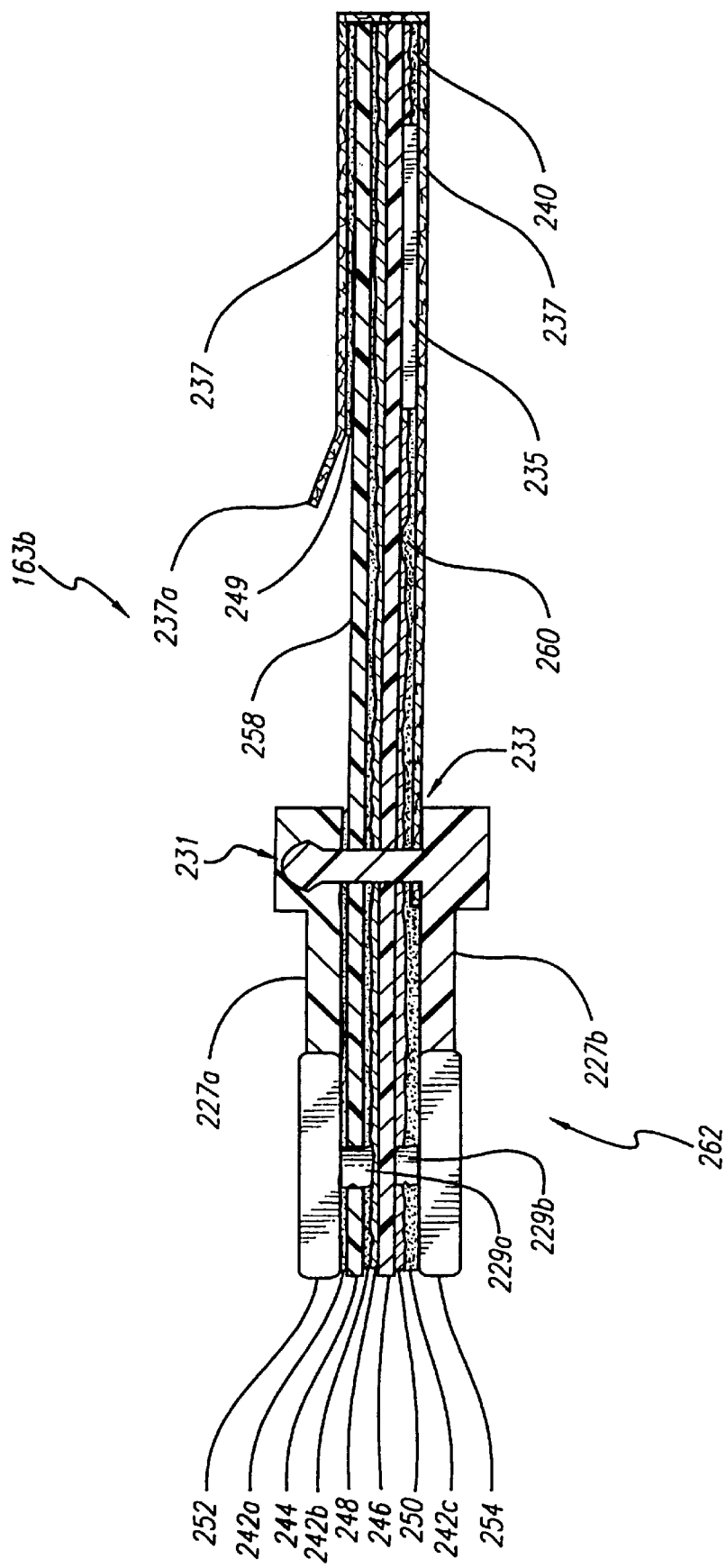
FIG. 10 shows a cross-sectional view of the various interrelated layers of a removable connector tab in FIG. 8.

Outer layer of thermistor 100 has, as the next layer above it, one or more conductor traces 145. There are ten conductive traces shown in FIG. 6, but any number (one or more) can be laid on the insulator layers 101, 151 or 149. These can be a mix of power and data conductors, if necessary. Conductive traces 145 or 153 can be laminated on the bottom surface of a lower insulator layer, such as conductor trace 145 laminated to the top surface of insulator 101. A conductive trace 145 or 153 can also be attached to the bottom of a layer 151 above it. FIGS. 9 and 10 show a cross-section of a representative layer configuration. Insulator layer 179 shown in FIG. 9 has the conductive traces 165 and 161 laminated to both sides, which would be very efficient if etched copper traces on kapton or mylar were being employed, since this two-sided lay-up is available as a stock item.

A layer of conductors 145 and 153 is sandwiched between insulator film layers 151 and 149. There are five such conductor 145s and 153s shown here. There will always be two conductors, here 145 and 153, for each contact on a battery housing 115. They may all be adjacent to each other within a two insulator sandwich (for example between layers 101 and 151, or between layers 151 and 149), or they can be staggered between various layers of insulators. There are no maximum number of either conductive traces 145 and 153, or insulator film layers 101, 151, and 149.

Y-Connector

By having an insulator layer 149 between the two groups of conductive traces 145 and 153, connector 200 can act as a Y-connector to any device (not shown) attached to cable 139, via connectors 141 and 143. Conductive trace 145 is on one side of insulator layer 151 (below it as shown here), while each conductive trace 153 is above layer 151. Thus, conductive trace 145 and its counterparts, are making contact with battery contacts 131 and 137 on the forward facing end of the battery housing 115, while conductive trace 153 and its counterparts are on the opposite side of insulator layer 151, and not covered by layer 149 at the location of battery contacts 131 and 137. Conductive traces 153 are thus exposed to whatever opposing connector (for example, a host device not shown) would have that matches battery contacts 131 and 137.

Thus, power (or data) from battery contact 137 flows along conductive trace 145, to its remote contact pad 155 on tab 119 at the opposite end of a battery 115. Power or data from a device to which the battery is normally attached (not shown here) would make contact with conductive trace 145 at the same location as battery contact 137, but on the outside of multi-layered connector 200, where conductor 153 is exposed. Overlapping conductive tabs 136 on both conductor 145 and 153 allow opposing attachable devices, for example a battery 115 and a host device (not shown) into which battery 115 is inserted, to correctly align. Since conductive tabs 136 are aligned to each other by overlapping the location of contact 137, and insulated from each other by layer 151, each conductor of the pair formed by 145 and 153 serves only battery 115, or its mating counterpart, such as a host device. The power (or data) from the host device (not shown) travels along conductor 153 to contact pad 157. When connector 141 is attached to tab 119, the two conductive paths created by 145 and 153 are separately available to a third device (not shown), via cable 139. Thus, this third device (not shown) can be a combination battery charger and power supply, for example. The charger circuit in an attached combination charger/power supply can charge battery 115 (using conductive trace 145 to battery contact 137), while the power supply circuit in an attached combination charger/power supply separately and simultaneously delivers power to a host device (not shown) along conductive trace 153, which makes contact with the corresponding contact (not shown) in a host device that corresponds to battery contact 137.

Discrete Thermistor Contacts

Thermistor 100's resistive element 109 exits on tab 119 also, but these contact pads (shown more clearly as pads 103 and 107 in FIGS. 1–4) are on the underside of tab 119. Contact pads 103 and 107 in FIGS. 1–4, as equivalents expressed here in FIG. 6, are directly below the row of ten contact points 155 and 157, et al. Thermistor 100 occupies two of the twelve conductor wires in cable 139, of which one can be a shared ground, depending on the design of the temperature sensing circuit (not shown). Thermistor 100's contact pads 155, 157, et al in FIG. 6 are kept separate from the ten power/data lines in connector 143, which has independent upper and lower contacts.

This is only to simplify fabrication, since keeping the termination points of resistive element 109 on the same plane of medium 101 avoids having to resort to vias or other mechanical transitions to other layers on tab 119. This also helps to minimize the spacing and final width of connector 143. Connector 143 can be further minimized in width by using pins, instead of contact pads 155 and 157 to transfer power or data. Some of contact pads 155 or 157 can be routed below insulator layer 151 on tab 119, as needed, to further minimize width.

Receptacle 141 in FIG. 6 can also be a jumpered terminating block. FIG. 7 shows connector 209 which, using cross-wiring 211, reconnects discrete conductors 145 and 153 by electrically jumpering contact pads 155 and 157 together. By jumpering these contacts, the conductive paths between the battery and its host device are re-established. The presence of thermistor 100 and connector matrix 200 in the battery/host interface is electrically removed when connector 141 is wired as a jumpered terminal block. Thus, the simple process of disconnecting connector 141 and replacing it with a jumpered connector allows the battery and host device to operate as if thermistor 100 and connector construct 141 were not present.

If battery 115 is a "smart" device, as defined in the System Management Bus (SMBus) specifications (available on the internet at www.sbs-forum.org), it will have it's own internal thermistor. This internal thermistor (not shown) is addressable at one of the contacts 129, 131, 133, 135, 137 shown in FIG. 4. Thermistor 100, whether as an internal second temperature sensor inside battery 115, or applied externally as in FIG. 6, provides additional battery-safety protection against overheating and possible cell explosion.

As shown in FIG. 7, thermistor 100, is in the form of a multi-segmented panel 213, attached to a six-cell cluster 217 in battery pack 115. Two panel 213s are used, each monitoring a group of three cells 215. Conductors from each panel 213 have been eliminated for clarity (reference FIG. 5A and FIG. 5B for conductor details). Also not shown herein is a "smart" battery circuit, used to monitor cell temperature, current and voltage. Typically, such a circuit would be installed at connector 201, and power lines 129*a* and 137*a* would interface with the "smart" circuit, then continue to connector 201. The "T" (Temperature), "D" (Data), and "C" (Clock) data-lines would also interface with a "smart" circuit at connector 201. Connector 201 is the data and power interface to a host device, for example a laptop computer.

Figure 8:
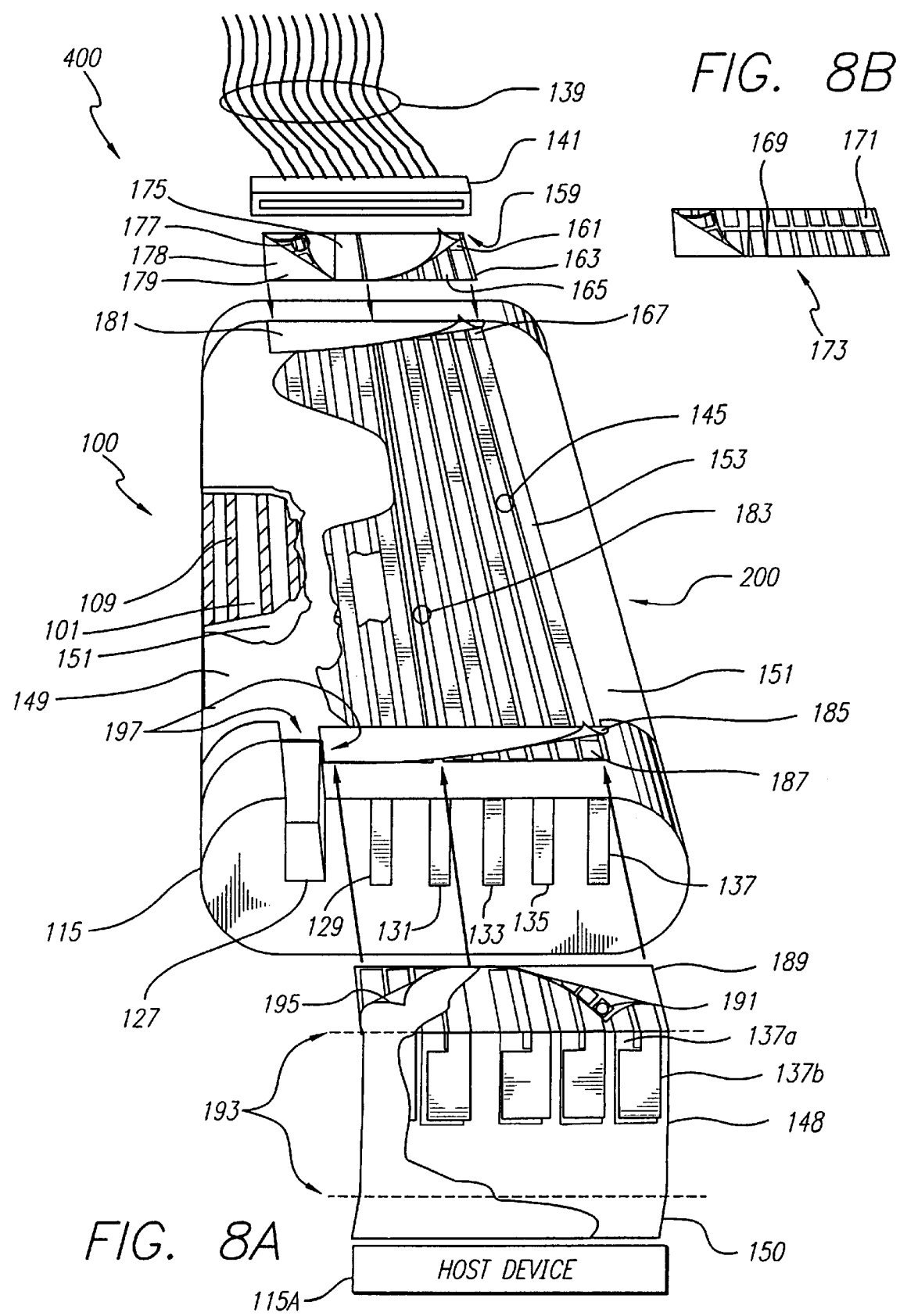
FIG. 8 shows the same elements of the temperature-monitoring apparatus depicted in FIG. 6, attached externally to a "smart" battery pack, with replaceable data and power conductor extensions at both end of the battery housing.

Connector 200, as described in FIGS. 6 and 8, is represented here with internal conductors 129*a*, 131*a*, 133*a*, 135*a*, and 137*a* (numbering herein corresponds to conductors in FIG. 6 for clarity). Connectors 199*a*, and 199*b* in FIG. 7 correspond to the row of connectors on extended tab 143 in FIG. 6. Connectors 199*a* and 199*b* herein serve the purpose of segregating wires/conductors into two branches of a Y-connector. With connectors 199*a* and 199*b* in FIG. 7 configured with conductors corresponding to 129*a* and *b*, 131*a* and *b*, 133*a* and *b*, 135*a* and *b*, as well as 137*a* and b in FIG. 6, this modality of thermistor 100 and connector construct 200 creates individual control and monitoring of cell group 217 as a function separate and apart from a host device (not shown).

Thus configured, battery pack charging functions can be monitored and controlled by an external device, for example a combination charger and power supply (not shown). Connector 203 is used for such a combination charger power supply, delivering battery charging functions to connector 199*a*. Connector 199*b* on battery pack 115 accepts power from the right five pins of connector 203. Power is them carried on lines 129*a* and 137*a* to connector 201, which attaches to a host device (not shown).

Thermistor 100, as two multi-segmented panels 213, is accessible from both a host device (not shown) or a data-enabled charger/power supply (not shown). The "T" (Temperature) contacts on connectors 199*a*, 199*b* and 201 each can access thermistor 100's temperature readings. The "smart" circuit (not shown) near connector 201 makes this available on data line 131*a*. Data line 131 loops to the "T" contact on all three-connectors (201, 199*a* and 199*b*) so that any device connected to battery pack 115 can access temperature data.

Connector Location

Connectors 199*a* and 199*b* (FIG. 7) are recessed into battery enclosure 115. This end of battery pack 115 is accessible in the battery bay of the host device (not shown), so that any of connectors 203, 205*a* and 205*a*, or 209 can be plugged in without removing the battery. Because the Y-connector created as described above services both the battery cells 217 and the host device (not shown) simultaneously, this connector, wiring configuration and thermistor that is the device of the invention, replaces the traditional power port found on electronic devices, of which a laptop computer is an example. Functions of battery charging, powering the host device, and monitoring "smart" battery functions can still be normally. Or, in the alternative, such functions can be reallocated to various external devices, such as combined chargers/power supplies, or monitoring equipment attached to connectors 199*a* and 199*b*.

For example, connector 205*a* can be used to charge cells 217 via connector 199*a*, which is wired along power lines 129*e*, and 137*e*, directly to cells 215. Temperature from thermistor panels 213 can be read, as can the "smart" battery's clock and data functions, via the T, D, and C contacts on connector 199*a*, since these are tied into data lines 131*a*, 133*a*, and 135*a*, using conductors 135*e*, 133*e*, and 129*e*. Connector 205*a* should be keyed, in order to avoid risks of reversed polarity.

An external power supply can use connector 205*b* (FIG. 7) to power the host device. Power from connector 205*b* to the (+) and (−) contacts of connector 199b, then along power lines 129a and 137a to the (+) and (−) contacts on connector 201, and finally to the attached host device. Battery pack 115, incorporating this wiring, connector and thermistor combination, need not be removable, since all battery functions normally associated with remote external battery charging stations are now available to battery pack 115 when it is still in the host device. One laptop, the Mitsubishi Pedion, is sold with a non-removable battery pack, so this concept has been validated in the marketplace. In a non-removable battery configuration, connector 201 would not exist, and conductors 129a, 131a, 133a, 135a, and 137a would be hardwired to the host device.

Connector 209 is a simple jumper. Wiring 211 is shown herein diagrammatically, so that the traces across paired pins can be seen. Jumper connector 209, when inserted into connectors 199a and 199b, returns the battery to a mode as if none of the connector and wiring modifications heretofore discussed for FIG. 7 had been made. Battery cells now power the host device, via jumper 209's cross-wired contacts, as would be with any non-modified battery.

Design and Fabrication Notes

FIG. 7 shows battery pack 115 as representational of a Duracell BR-15 configuration. There are hundreds of battery enclosure designs, shapes and sizes. Therefore, the location of connectors 199a and 199b, while appropriate for battery pack 115 as shown here, may vary considerably for other configurations. The two connectors should, where practical be installed adjacent to each other. This is important if a connector 203, or equivalent will be used. Connectors 199a and 199b can be mounted above and below each other, or in other configurations to suit the battery pack 115 design. Connectors 199a and 199b should be, where practical, be accessible without removing the battery pack. There are battery packs that are not as accessible as the one shown in FIG. 7. Use an "extension cord," for example a flat ribbon cable, to route from an inaccessible battery pack to a convenient location on the host device where connectors 119a and 199b can be mounted.

If a battery pack 115 is accessible within its host device via a hinged or removable access door, consider mounting the equivalent of jumper connector 209 so that it will attach to connectors 199a and 199b whenever the access door is closed. Thus, when no external devices are attached, all functions are returned to a direct connection between the battery pack and its host device.

Variations in the way thermistors 213 (FIG. 7) are attached to cells 215, routing and location of internal wiring 129a, 131a, 133a, 135a, and 137a should be planned around available wiring paths in the battery pack. The number and functions of contacts at connector 201 may vary, so that connectors 199a and 199b may require different wiring.

As shown in FIG. 8, a flexible, multi-conductor connector construct 200 incorporates thermistor 100. The entire device 400 is illustrated here as a modified or second modality, and is related to FIG. 6. Removable tabs 163 and 148 create a benefit of being able to return battery 115 to its original configuration, while keeping intact connector construct 200 (reference "Theory of Operation" below). Also, normal wear and tear caused by inserting and removing battery 115 into its host device would be most pronounced at the ends of battery 115, where connector 143 and 163 are. While the modality of the connector construct 200 and its integrated thermistor 100 are durable, user handling of tabs 163 and 148 could, over time, potentially compromise their mechanical and electrical integrity. This might occur by repeated flexing of tabs 119 and 147, for example. Tab 147 interfaces with what typically are spring-loaded contacts in a host device (not shown), for example a laptop computer. Repeated insertions and retractions of battery 115 against such abrasive contacts may, over time, deteriorate conductivity.

Inexpensive replaceable tabs 163 and 148 preserve the more costly connector construct 200. Also, if connector 200 is end-user applied to battery 115, removable tab 148 allows minor realignments of contacts 191 to 187, as well as mating contacts 137 and 137a.

Positionable/Removable/Replaceable Tabs

The extending tabs at both ends of the battery 115 (FIG. 8) are removable, so that previous iteration of tabs 119 and 147 in FIG. 6 are now a separate and discrete tabs 163 and 148. Attachable tab 163 is applied to battery 115 by first peeling away lower protective layer 179, which reveals an adhesive layer 178. Item 173 shows tab 163 with top protective layer 175 removed, to expose a row of contacts 171.

Protective layer 181 on connector construct 200 of battery 115 is also removed, to expose the row of contacts 167. The mating row of contacts 177 on removable tab 163 (contacts 171 on detail 173) is also exposed when protective layer 179 is removed. The contact row 177 on removable tab 163 is mated to contact row 167 on connector construct 200, which causes tab 163 to act as an extension of the various conductors (for example, 145 and 153, as well as thermistor trace 109), so that connector 141 can be attached to a battery 115. Detail item 173 shows tab 163 with the contact row 171.

At the other end of battery 115, the equivalent construct as tab 163 is used on extension tab 148. When top and bottom protective coverings 195 and 189 are removed, both top and bottom contacts 137a, 137b and 191 are exposed. Once protective layer 185 is removed to expose contact row 187 (which mates with contact row 191 on tab 148), the assembly is attached to connector construct 200 on battery 115 so that all ten contacts on the lower side of tab 148 line up. An adhesive on the back face of tab 148 keeps the assembly in place on battery 115. To further secure tab 148, it folds along fold line 193 so that a flap 150 is created. Adhesive-backed flap 50 further secures tab 148 and prevents it from moving or inadvertently peeling off.

Layers

The three insulator layers 101, 151, and 149 are detailed in FIG. 8, as referenced in FIG. 6, to illustrate how the stacking of conductors and insulator layers is achieved. Layer 149 is the outermost layer. Just as in FIG. 3 and its discussion about the ability to print information on the outside of thermistor 100's layer 101 or 113, so too here the outer surface of insulator layer 149 can be imprinted with information.

Operation of the Invention (FIGS. 6–8)

Thermistor 100, expressed as an external (FIGS. 1–4) or internal (FIGS. 5A and 5B) temperature sensor, adds to the safety of rechargeable battery packs by providing a sensor where none may have been available before. By adding external thermistor 100 in FIGS. 1–4, existing battery packs that were manufactured without any temperature-sensing are easily and inexpensively upgraded.

FIG. 5 represents an internal installation, but that may not indicate that a battery pack is fabricated with thermistor 100 pre-installed. The chain of manufacturing steps to produce a battery pack is a multi-layered activity. Primary cell manufacturers do not always offer finished goods (completed battery packs) to equipment vendors such as laptop or cellular phone manufacturers. Ideally, thermistor 100, expressed as a single thermistor bonded to an individual cell, should be attached to cells by the cell manufacturer. Depending on the type of rechargeable battery, battery manufacturers may opt to embed thermistor 100 into the battery, instead of attaching it externally. This has been discussed above in the Principals of Operation for FIG. 1.

A second level of battery pack assemblers purchases raw cells, and configures them into battery packs. Assemblers provide a logical point-of-manufacture where a silk-screening press can be installed, for example, so that thermistor 100 can be integrated into a battery in the mode detailed in FIG. 5. However, the class of batteries identified as "rechargeables" extends into the consumer market. Energizer sells rechargeable alkaline batteries for use in toys, portable audio equipment, etc. Consumers have an opportunity to attach a single thermistor 100 temperature sensor to cells they purchase for their personal electronics products. If the powered device has battery holders that configure cells adjacent to each other, a multi-segmented thermistor 213 in FIG. 5 offers a simple solution. Another modality of thermistor panel 213 in FIG. 5 is to attach the temperature panel to the interior cavity of an "openable" battery case, so that the cells make approximate contact to a temperature sensor that stays with the host device.

In all of these operational modalities, the effectiveness of thermistor 100 in FIGS. 1–5B is contingent upon there being data acquisition devices or circuits that can access resistive element 109's changes of state (resistance changes created by increases or decreases in temperature). Such external devices to the thermistor of the present invention are not within the scope of the invention. Any attached devices used to monitor a battery's temperature devices need not be sophisticated. A simple multi-meter, properly calibrated, can be used to display thermistor 100's present resistive value. Converting these Ohm-values to a valid "alarm" temperature above which the battery should not heat can be accomplished by calibrating the multi-meter indicated changes in resistance to a reasonably accurate thermometer (preferably a surface-reading thermometer). The final resistive value can be stored in the multi-meter's memory, otherwise memorialized.

As detailed in FIGS. 6–8, thermistor 100 is a preferred mode for battery packs that are enabled with data connections. Such batteries, typified generically as "smart" batteries, have integrated A/D capabilities both in the battery pack itself, as well as in the host device. These smart batteries and electronic devices, such as laptop computers and cellular phones, afford thermistor 100 a communications platform. Thus, thermistor 100, when configured with connector construct 200 in FIGS. 6–8, can participate in the information stream between the "smart" battery and its "smart-compliant" host. Furthermore, by incorporating connector construct 200, thermistor 100 becomes seemlessly integrated with existing smart circuitry without any rewiring or major modifications to consumer devices.

Thermistor 100, with its connector construct 200 in FIG. 6 and FIG. 8, provides improved temperature monitoring with a simple, consumer-attachable device that applies like a normal label. Thermistor 100 is already accounted for in the "smart" battery specifications under System Management Bus (SMBus), as a second thermistor that provides redundant temperature information on the SMBus. Furthermore, under proposed SMBus specification revisions, "extended" SMBus functions will be allowed to allow smart batteries and host devices to connect and communicate to external devices, such as an external "smart" power supply or charger. It will then be possible for the functionality of thermistor 100 in FIGS. 1–5B to be optimized with external devices that can access temperature data from an applied temperature sensor.

In the overview, thermistor 100 and connector 200 are considered the best mode, but only in context of the present availability of data-enabled devices to which the invention attaches. As these data-enabled devices extend into external equipment, thermistor 100 in FIGS. 1–5 becomes a significant preferred modality of the invention, in and of itself.

FIG. 8 represents a modality of connector construct 200, with integrated thermistor 100, that features removable conductor tab 163 (and detail 173). FIG. 9 is a cross-sectional view of a construct represented as attachable tab 163 (or 173) in FIG. 8. FIG. 9 shows a mode of fabrication of a tab 163a that has a rigid terminator block 256 (female), instead of edge-connector tab 163 in FIG. 8. Tab 163a in FIG. 9 can replace tab 163 in FIG. 8. FIG. expresses another mode of FIG. 9's tab 163a, with a male connector 262 shown on tab 163b in FIG. 10.

Female receptacle 256 in FIG. 9 is not intended to mate with male plug 262 in FIG. 10. Suitable mating parts, both male and female, that connect to FIG. 9's receptacle 256, or FIG. 10's plug 262 are not part of the present invention. Mating parts can be fabricated with compatible interface mechanisms, using models of the connectors shown in FIGS. 9 and 10. It is suggested, however, that using ribbon cable would facilitate fabrication of such compatible connector mates.

Conductive contact pad 254 can be used to conduct voltage or current from thermistor 100, since it is located on the underside of replaceable tab 163a. Thermistor 100, as shown in FIGS. 6 and 8 exists below insulator layer 246 in FIG. 9, so using the bottom-facing contact 254 is practical. However, lower contact pad 254 can be used for other conductors than thermistor 100's.

Upper contact pad 252 can be used for power or data, as defined in the text and drawings of FIGS. 6 and 8. There may be more than one contact pad on the top or bottom of connector 256 in FIG. 9.

Adhesive layers 242a, 242b, and 242c are discussed later below in the discussion of peel-away protective film 237 in FIG. 9.

Conductive layers 248 and 250, which are comprised of conductive material, for example copper which has been laminated to mylar or kapton, or conductive ink on mylar or kapton.

Insulator layers 244 and 246, for example kapton, mylar, vinyl, label stock or various papers.

Through-hole conductive transfer material 229 and 249, for example can be solder flowed into holes in insulator layers 244 and 246.

Housing 227a and 227b for the connector can be attached with adhesive 242a or 242c, and/or with mechanical fasteners, such as pin 231.

The peel-away protective film 237 is captured by sandwiching it under the back edge of connector housing 227b, and pin 231 also holds film 237 in place. Protective film 237 uses a low-tack glue 239 to keep it temporarily secured. When pull tab 237a is lifted, adhesive layer 239 stays on protective film 237, and cleanly comes away from the surfaces of layer 244. As protective layer 237 is peeled away, it exposes lower glue areas 260 and 240. Glue areas 260 and 240 do not adhere to protective film 237, but remain to bond to the surface of a device to which connector tab 163a is to be affixed, for example, connector construct 200 in FIG. 8.

Conductive tab 235 transfers power or data to corresponding tabs 167 in FIG. 8. As shown here, conductive layer 248 is connected to contact 235 via conductive transfer material 249, as described in through-hole material 229 above. Were contact 235 to be electrically connected to conductive layer 250, there would be direct contact between contact plate 235 and conductive material 250. Here, conductive material 250 is directed around contact pad 235, so that there is no electrical connectivity between material 250 and contact pad 235.

Also note that connector 143 in FIG. 6, connector 163 in FIG. 8, and connectors 163a and 163b in FIGS. 9 and 10 respectively, can all be built with additional layers of conductive material 248, adhesive 242 (a, b, or c), and insulator material 246. This would add extra rigidity to removable tab 163 in FIG. 8, but extra layers would also add to total overall thickness, which may not be desirable for battery pack-type devices that are required to slide in and out of battery slots or bays in laptops or cell phones, for example.

FIG. 10 is the same as FIG. 9, except that connector housing 256 is herein shown as a male plug, instead of FIG. 9's female receptacle.

It is appreciated that connector construct 200 described in FIGS. 6–8 can be built with a third layer of FIG. 9 and 10's conductive material 248 or 250, adhesive 242a–c, and insulator material 246. This would give two layers for conductors 145 and 153 in FIGS. 6 and 8, and a third layer for thermistor 100 as resistive element 109.

Theory of Operation

As presently understood, the theory of operation for the device of the present invention revolves around several assumptions or beliefs. A principle belief which serves as the basic assumption in the theory of operation is that battery charging has inherent dangers and risks. These risks stem from direct observations of rechargeable batteries that have overheated under "normal" charge conditions, as well as conversations with colleagues (some of whom manufacture rechargeable battery cells) who have confirmed the instability of battery chemistries. As an active participant in the Smart Battery Systems (SBS) Implementers Forum, a group of manufacturers that designs products based on the System Management Bus (SMBus) specifications, I have first-hand knowledge of battery functions.

Further evidence of potential risk is indicated by the growing implementation of "smart" battery systems in laptop computers and cellular phones. Were such batteries intrinsically safe, the need for sophisticated (and expensive) "smart" battery temperature sensing would not be part of almost every contemporary battery pack design and implementation.

One assumption is that there may come a time when traditional battery charging with the battery pack in situ might not be the best, or safest, mode. This will be especially true when issues of battery charging safety, including temperature monitoring of cells (or the entire battery pack), make it desirable to monitor or control battery charging activities from an external, rather than internal, charging circuit.

For example, one hypothetical theory of operation of the invention uses a combination external battery charger and discrete power supply that is embedded at the passenger seat of a commercial airliner. My belief is that the potential dangers inherent in charging batteries is elevated to a level of extreme risk in locations such as in the cabin of a commercial airliner. Should a battery vent excessively, due to excess pressure brought on by over-heating, within the sealed air-circulation system of an aircraft cabin, toxic fumes would be unable to escape. If undetected heat from an overcharged battery were to become excessive enough to cause an explosion, passengers would be trapped.

An embedded power source and charger, at locations where battery charging risks would be normally unacceptable, may allow the charging of batteries, provided that a suitable temperature sensor capable of detecting over-heating during the charge cycle is available at the battery pack. A passenger's laptop, as an example, may have been manufactured without any internal "smart" battery circuitry, and would be thus incapable of monitoring its own battery temperature.

In such a situation, the externally applied thermistor shown in FIGS. 1–4 can be useful, by enabling an external temperature monitoring device to detect changes in battery temperature during the charge cycle. An external monitoring device at each seat can deactivate input power to the offending device if excessive battery pack temperatures are detected. This provides a margin of safety that the user's device may not be able to supply. In this theoretical, the best mode of the invention would be expressed in FIGS. 1–4. Such an external thermistor can be installed by the passenger while on a plane, thus eliminating inconvenience and also providing safety.

Because the thermistor shown in FIGS. 1–4 and elsewhere can be manufactured with low-cost materials such as printed ink on label stock or coated paper, these inexpensive "do-it-yourself" disposable thermistors can be provided to passengers. Passengers can peel away a backing sheet to expose a low-tack adhesive, then affix the thermistor to the battery pack as if it were a label. After the flight, the passenger can remove the temporary temperature sensor, returning the battery pack to its original state.

In FIGS. 1–4, conductor 105 could terminate in a connector compatible with an in-seat power port or access an embedded charger. This power supply or charger can be manufactured with A/D capabilities, to read resistive values from thermistor 100. By pre-setting "alarm" levels indicating "not-to-exceed" temperatures in the embedded devices, the charger or power supply can have a self-regulating shut-off. As temperatures sensed by periodic sampling of thermistor 100 begin to approach the "alarm" trigger point, messages can be sent to users (if a display screen is available) advising them of this potentially unsafe condition.

FIGS. 6–8 show thermistor 100 integrated into a connector construct which provides for not only external monitoring of thermistor 100, but also bidirectional data to the battery and the host device. In this modality, "alarms" can be handled not only by communications from an externally embedded power supply or charger to the host device, but by direct communications from an external charger directly to the data-enabled battery.

Second Theory of Operation

My awareness of the volatility of battery chemistries in the charge state suggests another theoretical model. It is believed that no battery charging activities whatsoever will be allowed aboard passenger-carrying aircraft. The issue has already been raised by an article in the Wall Street Journal titled "Is Recharging Laptop in Flight A Safety Risk?" (Apr. 2, 1998, pg. B1).

This poses some unique problems. The battery charging circuit in electronic devices such as laptops and cell phones is a discrete, hardwired sub-system that cannot be easily disabled. The wiring within the equipment's power circuit does not isolate the charging circuit from the main power circuit that operates the device's primary electronics. Every time external power is connected to a laptop, or equivalent electronic equipment, the charger function commences automatically. It cannot be disabled with software.

Without some means of isolating the device's internal charging circuitry so that it can be manipulated and controlled independently of the rest of the device's electronics, the user would not be able to use a device like a laptop computer on an airplane (or at other locations where battery charging poses a risk). Power to the primary circuits of a powered device would have to be provided from another input point than the standard power port, since introducing power at the device's normal power port would automatically enable the battery charging circuit.

In theory, electronic devices with "smart" battery circuitry like that designed around the SMBus specifications, could disable the battery charging function independently from the active main power circuit. This has never been done.

Separating Charging and Primary Power Circuits

The most reliable way to achieve such a separation of the charge functions from primary device power is to use a thermistor 100 in a connector construct 200, as indicated in FIGS. 6–8. This flexible, multi-layered construct provides independent temperature sensing to an external monitoring system, as well as bi-directional data to a "smart" battery. Because connector tab 147 in FIG. 6 has two sets of conductive traces, any two pair of which can be used for power, connector 200 can power a host device independently of power from the battery pack. Selected conductors can deliver power and data to a host device, while others monitor thermistor 100.

FIGS. 6–8 represent the preferred mode of the invention in a model where battery charging is not allowed, and a powered device has a "smart" battery system. Because the ink-based thermistor is integrated, a safe temperature-based override is available to an external monitoring device in the aircraft seat.

As with thermistor 100 in FIGS. 1–4, the thermistor and connector construct shown in FIGS. 6 and 8 can be self-applied, and is also useable on non-smart battery packs (only the power conductors and integrated thermistor circuit would be active in this modality).

Thus, these theories of operation, while not limiting the scope or uses of the thermistor of the invention, indicates a need for a reliable, low-cost method of providing battery charging safety (or, in the alternative, disabling battery charge functions without incapacitating the use of a host device).

CONCLUSION, RAMIFICATIONS, AND SCOPE OF INVENTION

Accordingly, it is appreciated that the apparatus for monitoring temperature that is the present invention can be used to provide additional charging safety when integrated or attached to a battery cell or battery pack. Improved safety can be achieved by wrapping a permanently installed temperature-sensor around each cell in a battery pack. By locating discrete thermistors directly at all heat sources (cells) within a battery pack, the thermistors can deliver rapid and highly accurate localized temperature responses to a monitoring/telemetry circuit within a battery pack. In the alternative, sensor information can be directed to an external remote monitor, charging circuit, or power source. Thermistor 100 also has a modality wherein it serves as a semi-permanent or disposable temperature sensor attached to the exterior of an existing battery pack.

By using low-cost and readily available materials, such as label stock or coated papers, and thermally-resistive and conductive inks, a thermistor can be manufactured in large quantities at prices well below traditional temperature sensors. Since the materials used to fabricate the thermistor are quite thin and have good flexural integrity, the temperature sensor is conformable to small objects, like individual cylindrical battery cells. The thermistor can also be readily wrapped around the contours of a variety of battery pack shapes, without adding undesirable thickness that changes the battery enclosure's original dimensions.

The thin cross-section of the thermistor allows it to be manufactured with multiple layers that comprise additional conductive traces for power and data. These power and data traces can be directed to an internal circuit within a "smart" battery pack, or routed externally, via a connector, to a remote monitoring or power source/charging circuit. When the modality of the multi-layered thermistor that incorporates power and data conductors is attached to a data-enabled battery pack, users gain added safety from both the battery's original internal temperature sensor (if present), as well as the enhanced temperature sensing of a larger-surfaced external thermistor.

The printed ink used in the present invention can be directly applied to any material that can be silkscreened, which makes it especially economical and convenient for applications like the nylon material used as enclosures for polymorphic cells, for example. When printed on such materials, or equivalents that can be fed through a silk-screening press, bar codes or other information can be simultaneously printed on the same, or obverse side, of the material. The application of adhesives can also be included as a simple adjunct to the printing process, and such bonding materials allow the thermistor to be adhered to cell casings or external battery pack housings. By relying on traditional printing and adhesive-application processes, the speed and costs of manufacture are minimized, allowing large production runs.

Although the description above contains many specifications, these should not be construed as limiting the scope of the invention, but as merely providing illustrations of some of the presently preferred embodiments of this invention.

For example, leads 105 in FIGS. 1–4 can be attached by chemical or thermal adhesive bonding, sonic welds, wave soldering, or by mere pressure contacts or clips. In the same drawing, optional second stratum 113 can be attached to medium 101 by heat/pressure fusing, sonic fusing, or gluing.

Conductive pads 107 and 103 in FIGS. 1 and 2, and the equivalent contacts in FIGS. 6–8, are not limited in shape, general size, or materials. Materials such as silver-pigmented epoxy cements, or silvered conductive inks are acceptable substitutes that can be printed or painted directly on the substrate.

Since it is feasible that the internal circuitry of a battery pack may have been outfitted with the second allowable temperature-sensing mechanism at the time of manufacture, thermistor 100 in FIG. 6 and elsewhere would be unnecessary. Without limiting the assembly that is the present invention, thermistor 100 and its associated parts can be eliminated from the multi-layered construct without significantly impacting its functionality as a connector construct. Even without a temperature sensor, the remaining data and power lines, connectors and other elements provide a functional sub-assembly that will allow functions like independent battery charging while simultaneously powering a host device. Because of the way connector construct 200 in FIG. 6 and elsewhere interconnects two or more devices, the lack of a thermistor 100 still leaves intact a functional assembly.

The shape and orientation of attachment of thermistor 100 in FIGS. 2–4 on battery pack 115 can vary according to the configuration of battery pack 115 onto which thermistor 100 is being applied. Thermistor element 109 in FIGS. 1–4 and FIGS. 6–8 can vary dimensionally, so that it can be represented as a rectangle, square, or other shape or thickness appropriate to the desired resistance required by the monitoring circuit, as well as to cover larger or smaller areas of a power source.

The properties of the thermally conductive inks used in the present invention prescribe a resistivity that changes in response to ambient temperatures, so that resistivity increases as ambient temperature increases. This description characterizes a number of commercially available positive temperature coefficient (PTC) inks, but the invention can also accommodate those materials, not necessarily inks, which exhibit decreases in resistivity with increases of temperature, i.e., negative temperature coefficient (NTC) materials. When PTC inks are used, their upward changes in resistance with temperature increases may require a "reverse reading" conversion in circuits that expect an NTC input. Chips equivalent to the Benchmarq (Austin, Tex.) 2N3904 facilitate this conversion.

Detachable connector 124 in FIG. 4 (also as connector 141 in FIGS. 6 and 8) can be of different shapes than indicated. The rectangular block configuration is illustrated only because male attachment pad 120 in FIG. 4, for example, is flat and elongated. Thus, any suitable connector that conforms to the contour, shape and thickness of attachment tab 119 is acceptable. Connector 124 can be totally eliminated, with an alternative of hardwiring a ribbon cable directly to connector tab 119.

The external placement of thermistor 100 in FIGS. 2 and 3, are shown only because the intended application is for a user-applied device. For manufacturing, the thermistor and associated conductors can be located inside the battery pack housing. Thus, for example, a hybrid model can be constructed which has discrete thermistors wrapped around each cell, as well as data and power conductors (shown as 129a, 129b, 131a, 131b, 133a, 133b, 135a, 135b, 137a, and 137b in FIG. 6) that transition internally from a main connector to the opposite end of battery housing 115 in FIG. 6. A suitable equivalent of connector 141 or connector tab 119 can be molded into that end cap (not numbered, but to the aft end as drawn). Thermistor 100 in FIG. 6 can also be attached externally to battery pack 115 that has data and power conductors internally configured.

Battery connectors 129, 131, 133, 135 and 137 in FIG. 8 are representational only. Connector contact number, size, location, shape, keying, and spacing varies considerably. Thus, the shape, angle, and orientation of conductor grouping (shown as 129a, 129b, 131a, 131b, 133a, 133b, 135a, 135b, 137a, and 137b in FIG. 6) should be designed to reflect variations in the battery packs connector configuration.

The multiple layers of insulators 101, 151 and 149 in FIG. 8 can be transposed from bottom to top, or otherwise interchanged. However, thermistor 100 should always be kept in close proximity to the battery housing 115.

While the present invention has been described in detail with regards to the preferred embodiments, it is appreciated that other variations of the present invention maybe devised which do not depart from the inventive concept of the present invention. Thus, the scope of the invention should be determined by the appended claims and their legal equivalents, rather than by the examples given.

What is claimed is:

1. An apparatus for monitoring temperature functions of a power source, said apparatus comprising:

a non-conductive stratum having a major surface;

a first conductive element affixed upon said major surface and having an electrically accessible portion;

a second conductive element affixed upon said major surface parallel to said first conductive element, said second conductive element having a dimensionally- and electrically-equivalent accessible portion facing said first conductive element so as to provide an open area between said accessible conductive element portions for uniformly-applying a thermally-resistive ink covering said entire open area of said major surface between said spaced accessible conductive element portions, and to be in electrically-equivalent contact with each of said conductive elements along each said accessible portion; and said resistive-ink covered area, by changing its resistance value with a change in temperature, enables a determination of temperature based on the resistance value.

2. The apparatus as claimed in claim 1, comprising:

at least one additional conductive element, having an accessible portion dimensionally- and electrically-equivalent to said conductive elements already in electrical contact with said thermally-resistive ink area, electrically affixed upon said ink surface parallel to said existing conductive elements, thereby partitioning said inked area to define an additional independent temperature-sensing segment coupled to one of said existing conductive elements, at least one of said conductive elements also being electrically coupled to an adjacent functional temperature-sensing segment of said ink area.

3. The apparatus as claimed in claim 1, comprising a second nonconductive medium layered over said first nonconductive medium to form a multi-layered construct with said resistive element sandwiched between said nonconductive mediums, said second medium including a protective coating material.

4. The apparatus as claimed in claim 1, wherein said resistive element comprises a flexible resistive ink.

5. The apparatus as claimed in claim 1, wherein said resistive element comprises a resistive ink applied to said first nonconductive medium in the shape of a parallelogram.

6. The apparatus as claimed in claim 1, wherein said resistive element comprises an ink applied to said first non-conductive medium as a wide area of continuous film.

7. The apparatus as claimed in claim 1, wherein said resistive element comprises a positive temperature coefficient resistive ink.

8. The apparatus as claimed in claim 1, wherein at least one of said plurality of conductive elements is a flexible conductive ink.

9. The apparatus as claimed in claim 1, wherein:

said resistive element has a reconfigurable resistive-element geometry; and said monitoring includes temperature-sensing functions that can be modified by reconfiguring the resistive element's geometry, both during and after manufacture.

10. The apparatus as claimed in claim 1, further comprising a printable exterior surface for displaying indicia.

11. The apparatus as claimed in claim 1, wherein one of said first and second conductive elements is affixed upon said major surface by a low tack adhesive attaching means.

12. The apparatus as claimed in claim 1, wherein said resistive element constitutes a second resistive element for sensing temperature within a "smart" battery, there already being a first temperature-sensing element operative in said battery.

* * * * *